United States Patent

Fujii et al.

[11] Patent Number: 5,999,005
[45] Date of Patent: *Dec. 7, 1999

[54] VOLTAGE AND DISPLACEMENT MEASURING APPARATUS AND PROBE

[75] Inventors: Akira Fujii; Yoko Sato; Soichi Hama; Kazuyuki Ozaki; Yoshiro Goto, all of Kawasaki; Yasutoshi Umehara; Yoshiaki Ogiso, both of Otaru, all of Japan

[73] Assignees: Fujitsu Limited, Kawasaki, Japan; Advantest Corporation, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/863,278

[22] Filed: May 27, 1997

Related U.S. Application Data

[62] Division of application No. 08/282,265, Jul. 29, 1994, Pat. No. 5,677,635.

[30] Foreign Application Priority Data

Nov. 22, 1993 [JP] Japan ..................................... 5-292036

[51] Int. Cl.$^6$ ..................................................... G01R 29/12
[52] U.S. Cl. ............................................. 324/750; 324/96
[58] Field of Search .............................. 324/754, 96, 755, 324/752, 750, 501; 439/482; 356/377, 400; 359/248, 249; 250/306, 307, 310, 311

[56] References Cited

U.S. PATENT DOCUMENTS 5,041,783  8/1991  Ohta et al. .
5,272,434  12/1993  Meyrueix et al. .
5,274,325  12/1993  Shinagawa et al. .
5,479,106  12/1995  Takahashi et al. .

FOREIGN PATENT DOCUMENTS 64-28566  3/1989  Japan .
2-238376  9/1990  Japan .
4-357472  12/1992  Japan .

*Primary Examiner*—Vinh P. Nguyen
*Attorney, Agent, or Firm*—Armstrong, Westerman, Hattori, McLeland & Naughton

[57] ABSTRACT

A voltage and displacement sensitive probe with an electro-optic crystal, electrically conductive transparent films and adhered to a pair of parallel surfaces on the electro-optic crystal, a transparent elastic film which circumferential portion is bonded to the frame and which is symmetric with respect to any plane through the axis thereof, a probing needle bonded at its reflective bottom surface to the central portion on the film, a holder for holding the electro-optic crystal and the transparent elastic film via frame concentrically, a lead for grounding, and electrically conductive films for connecting between the films. Displacement detection of the probing needle is based upon the change in the length of the path of the light travelling through the electro-optic crystal being reflected by the surface and travelling in reverse direction. Voltage detection of the probing needle is based upon the phase difference between the two linearly-polarized light components.

7 Claims, 17 Drawing Sheets

VOLTAGE AND DISPLACEMENT MEASURING APPARATUS AND PROBE

This is a divisional of application Ser. No. 08/282,265 filed Jul. 29, 1994, now U.S. Pat. No. 5,677,635.

BACKGROUND OF THE INVENTION

1. Field of the Invention

The present invention relates to a voltage & displacement measuring apparatus and its probe for measuring the position and voltage of a micro structure such as a wiring on a semiconductor chip.

2. Description of the Related Art

In order to measure voltages in the fine wiring on semiconductor integrated circuits, there are some measuring instruments using an electron beam, namely, an electron beam tester, and using a light beam, namely, a light beam tester.

An electron beam tester emits an electron beam on to a fine wire to be measured (measuring point) and detects the quantity and energy of secondary electrons emitted from this measuring point. The voltage is measured based upon this detection.

A light beam tester uses the electro-optic effect of crystals; by radiating a light beam into an electro-optic crystal which is positioned near the measuring point and detects the change of the polarization status of the light passed through the crystal, and the voltage is measured based upon this detection.

For measuring the waveform of a voltage pulse with a short leading edge or trailing edge time such as 1 nanosecond or less, with an electronic or light beam tester, a pulsed beam is used to sample the voltage at the time when the beam is irradiated.

With an electron beam tester, on the one hand, it is necessary to raise the spatial resolution by narrowly constricting the electron beam in comparison with the width of the wire at the measuring point while, on the other hand, it is also necessary to raise the time resolution by setting a short pulse width for the electron beam, in order to respond to rapid changes in the waveform being measured. Because of this, the number of electrons in the pulse beam is reduced and this, in turn, reduces the number of secondary electrons generated at the beam irradiation points, resulting in a deterioration of the S/N ratio (the voltage resolution is reduced). To deal with this, a cyclical test signal may be supplied to the semiconductor integrated circuit which is being measured, and a pulse beam is then radiated in the same phase for several cycles, and the average value of the detection signal can be used to improve the S/N ratio. However, this measuring procedure requires a long time.

Since the S/N ratio is reduced when the pulse width of an electron beam is narrower, and since the secondary electron detection signal spreads in the direction of time because there are differences in running time among secondary electrons, the upper limit of time resolution at present is approximately 5 pico-seconds and the realization of higher time resolution is difficult to achieve.

The light beam tester provides a higher time resolution, such as 0.5 pico-seconds, and a higher voltage resolution, namely higher S/N ratio, over the same values obtained for electron beam tester. However, since the spatial resolution is limited by the wavelength of the light, it is difficult to measure the voltage in a fine wire. Actually, it is possible to measure the voltage in wire having a diameter of 1 $\mu$m or more, at present, but it is difficult to measure voltage in any wire having a diameter less than that.

As has been explained, the electron beam tester provides good spatial resolution but is unsatisfactory in time while, in contrast, resolution and measuring time, the light beam tester excels in time resolution and measuring time, but is unsatisfactory in spatial resolution. Namely, these two types of testers have opposite and complementary advantages and shortcomings.

Furthermore, when probing a narrow wire on the order of sub-micron dimensions, with a light beam tester, the electrical contact with the wire is insufficient.

A probe for a voltage and displacement measuring apparatus which can improve the space and time resolution, would be conceived, the schematic structure of which is shown in FIG. 19.

The semiconductor chip 10 has the bonding wires 11, 12 connecting the pad on its surface and the inner lead (not shown).

The upper end of the cantilever 22 of the probe 20, is bonded to the lower end of the substrate 21 and the electrically conductive probing needle 23 is bonded to the lower end of the cantilever 22. The cantilever 22 and the probing needle 23 are of the type that are used in AFM (Atomic Force Microscope) and the cantilever 22 has the spring constant of 1 to 100 N/m and is, therefore, soft enough to measure. The diameter of the probing needle 23 at the top is very small (e.g., 50 nanometers or less). When the probing needle 23 is placed close to the semiconductor chip 10, a distance in the order of nanometers, or when the probing needle 23 contacts the semiconductor chip 10, displacement occurs in the cantilever 22. Displacement in the direction of the height of the probing needle 23 is measured by irradiating a laser beam from the laser 24 on to the upper surface of the lower end of the cantilever 22 and by detecting its reflected light with the PSD (Position Sensitive Detector) 25. While measuring this displacement, an X-Y scanning of the probe 20 relative to the semiconductor chip 10 is performed by applying a piezoelectric actuator. During the X-Y scan, the displacement of the probing needle 23 can be constant by controlling the Z-direction piezoelectric actuator, and an image of the concave-convex surface of the chip 10 can be obtained based upon the driving signal for the Z-direction piezoelectric actuator. This image will have a spatial resolution in the order of nanometers and the position of the probing needle 23 on the wire to be measured can be determined with an accuracy in the order of nanometers based upon this image.

In order to detect the potential at the measuring point, the electro-optic crystal 26 is bonded onto the substrate 21. The lower surface of the electro-optic crystal 26 is electrically connected with the probing needle 23 by an electrically conductive film and the electrically conductive transparent film which is adhered to the upper surface of the electro-optic crystal 26 is grounded. When the probing needle 23 contacts the measuring point on the wire or approaches the measuring point to within a distance on the order of nanometers, an electric field, due to the potential of the wire, is applied to the electro-optic crystal 26. The laser beam from the laser 28, which has been reflected by the mirror 27, enters the electro-optic crystal 26 and then the light reflected from the bottom of the electro-optic crystal 26 via a polarization beam splitter (not shown) is detected by the photodetector (not shown). The potential at the measuring point is measured based upon this detection.

However, since the tip of the probing needle 23 must either contact the semiconductor chip 10 or be in and after close proximity to it, there is a limit to the angle of inclination of the substrate 21 relative to the semiconductor chip 10. In addition, the probing needle 23 must scan the semiconductor chip 10 in such a manner that the substrate 21 does not interfere with the bonding wires 11 and 12. Accordingly, the probing needle 23 cannot scan in the range R shown in FIG. 19, resulting in an area that cannot be measured.

Also, since a mechanism is required that rotates the probe 20 or the chip 10 in correspondence with the position of the probe 20 on the chip 10 so that the probe does not interfere with the bonding wires, the structure and operation of the apparatus become complicated.

Furthermore, since an optical system for displacement measurement and a separate optical system for voltage measurement are required, the structure and the adjustment thereof become complicated.

SUMMARY OF THE INVENTION

Accordingly, an object of the present invention is to provide a voltage and displacement measuring apparatus and a probe which can perform measurement without interfering with bonding wires on the sample.

Another object of the present invention is to provide a voltage and displacement measuring apparatus and a probe which can achieve simplification of the structure and operation of the apparatus.

According to the first aspect of the present invention, there is provided a voltage and displacement sensitive probe comprising: a holder having a hole being approximately symmetrical with respect to a plurality of planes through the axis thereof; an electrically conductive elastic film located inside the hole, the outer end of the elastic film being bonded to the holder, the elastic film being approximately symmetrical with respect to a plurality of planes through the axis of the hole; an electrically conductive probing needle located under the elastic film with the tip of the probing needle downward and being coupled to the central portion of the elastic film; voltage information generating means, coupled to the holder at a position over the probing needle and connected electrically with the probing needle, for generating a voltage information of the probing needle against a reference potential in response to light beam entered therein, the voltage information being a form of either a photo-signal or an electrical-signal; and displacement information generating means, coupled to the holder at a position over the probing needle, for detecting an axial displacement information of the probing needle, the axial displacement information having a form of either a photo-signal or an electrical-signal.

With this arrangement, since each of the hole of the holder and the electrically conductive elastic film is approximately symmetrical with respect to a plurality of planes through the axis thereof, the electrically conductive elastic film is inside the hole, the outer end of the elastic film is bonded to the holder and the probing needle is positioned on the axis of the probe, the axis of the probe can be set vertical to the surface of the sample and measurement can be performed without the probe interfering with the bonding wires on the sample.

Furthermore, although in the case of the cantilever type probe shown in FIG. 19, a mechanism that rotates the probe or the sample is required to prevent the probe from interfering with the bonding wires and the like on the sample, the first aspect of the present invention eliminates the necessary for such a mechanism. As a result, the structure and operation of the voltage & displacement measuring apparatus that apples this probe can be simplified.

In the first mode of the first aspect of the present invention, the voltage information generating means is a voltage/phase-difference conversion means including: an electro-optic crystal having first and second surfaces which are parallel to one another and arranged vertically to the axis of the hole; a first electrode being a transparent film adhered to the first surface; a second electrode adhered to the second surface and connected electrically with the probing needle; a lead for supplying the reference potential to the first electrode; and reflective means for reflecting a light beam traveling from the first electrode through the electro-optic crystal and back.

With this arrangement, the voltage between the first electrode and the second electrode can be detected based on the phase-difference between two vertical components of linearly polarized light, the phase-difference created by the light beam traveling through the electro-optic crystal, being reflected by the reflective means and traveling back through the electro-optic crystal.

In the first form of the first mode of the first aspect of the present invention, the second electrode is a transparent film; the elastic film is transparent, or has a plurality of beam portions extending radially toward the outside from the central portion; the reflective means is the bottom surface of the probing needle or a reflective film on the elastic film; the probing needle is attached at its bottom surface directly or via the reflective means to the central portion of the elastic film; and the voltage/phase-difference conversion means is also the displacement information generating means.

With this, the axial displacement of the probing needle can be detected based on a change in length of the path of the light beam traveling through the voltage/phase-difference conversion means, being reflected by the reflective means and traveling back through the voltage/phase-difference conversion means.

It becomes possible to use a common optical system for displacement and voltage measurements to achieve a simplification of the structure and also a simplification of the adjustment.

Also, it becomes possible to observe the sample with an optical microscope by the reflected light from the sample the transparent elastic film or through between the beam portions in order to roughly determine a position of the probing needle relative to a voltage measuring point on the sample.

As described later, it is possible to use only one optical system, with displacement detection applying a strain gauge, or with displacement detection applying a capacity, which also simplifies the adjustment.

In the second form of the first mode of the first aspect of the present invention, the elastic film is transparent, or has plural beam portions extending radially toward the outside from the central portion, and also the first electrode; the first surface of the electro-optic crystal is bonded to the central portion of the elastic film; the probing needle is attached at its bottom surface to the second surface of the electro-optic crystal directly or via the reflective means; and the voltage/ phase-difference conversion means is also the displacement information generating means.

This second form achieves similar advantages to those achieved in the first form.

In the third form of the first mode of the first aspect of the present invention, the second electrode is a reflective film and also the reflective means; the probing needle is attached at its bottom surface to the reflective film; the elastic film is transparent, or has a plurality of beam portions extending radially toward the outside from the central portion; and the lead has a portion connecting electrically between the first electrode and the elastic film; the voltage and displacement sensitive probe further comprising a rod being hollow or solid and transparent, the rod being suspended vertically with an upper portion of the rod being bonded to the central portion of the elastic film; the voltage/phase-difference conversion means being bonded at the lower end of the rod with the tip of the probing needle downward.

This third form achieves similar advantages to those achieved in the first form.

As described below, it is possible to use only one optical system, with displacement detection applying a strain gauge, or with displacement detection applying capacitance; which also simplify the adjustment.

In the second mode of the first aspect of the present invention, the displacement information generating means is a strain gauge which links the outer end of the elastic film with the holder.

With this arrangement, it is possible to detect the displacement of the probing needle based on a change in the resistance value of the strain gauge.

In the third mode of the first aspect of the present invention, the displacement information generating means includes; a first electrically conductive plate an end of which is bonded to the rod with the other end being free; and a second electrically conductive plate, and end of which is bonded to the holder with the other end being free, the second electrically conductive plate being located so as to face and the first electrically conductive plate.

With this, it is possible to detect displacement of the probing needle based on a change in the capacitance between the first electrically conductive plate and the second electrically conductive plate.

In the fourth mode of the first aspect of the present invention, the voltage information generating means includes an electrically conductive transparent film; a photoconductive film which upper surface is adhered to the electrically conductive film, the photoconductive film being connected electrically with the probing needle; and a lead for supplying the reference potential to the electrically conductive film.

With this arrangement, it is possible to detect the voltage of the probing needle based on an electric current flowing in the lead when a light beam is irradiated on the photo conductive film.

In the fifth mode of the first aspect of the present invention, a first magnetic substance is attached in peripheral area of installation position of the probing needle, wherein the probing needle has a second magnetic substance at least at its bottom portion.

With this arrangement, the probing needle can be held by the residual magnetism of the first magnetic substance and the probing needle can be dropped with the demagnetization of the first magnetic substance. Therefore, when the tip of the probing needle has worn out, it is not necessary to replace the entire probe, but only the probing needle, achieving a reduction in operating costs. Also, as automation of probing needle replacement is possible, handling of the very small probing needles becomes easier.

According to the second aspect of the present invention, there is provided a voltage and displacement measuring apparatus comprises: the first mode of the first aspect of the present invention above, second voltage measuring means for measuring a voltage of the probing needle based on a phase-difference between two vertical components of linearly polarized light, the phase-difference being caused by the light beam traveling through the electro-optic crystal, being reflected by the reflective means and traveling back through the electro-optic crystal; and displacement measuring means for measuring an axial displacement of the probing needle based on a change in the length of a path of the light beam traveling through the voltage/phase-difference conversion means, being reflected by the reflective means and traveling back through the voltage/phase-difference conversion means.

In the first mode of the second aspect of the present invention, the voltage and displacement measuring means comprises: a laser for emitting the light beam; a beam splitter arranged so that the light beam enters thereinto, the beam splitter divides the light beam into penetrating light and reflected light, one of which being directed into the voltage & displacement sensitive probe; a reflector arranged so that the reflector reflects the other one of the penetrating light and the reflected light back to the beam splitter; a polarization beam splitter arranged so that interfered light, composed of light which is from the reflector and traveling through the beam splitter or reflected by the beam splitter and light which is from the probe and reflected by the beam splitter or traveling through the beam splitter, enters thereinto and the polarization beam splitter divides the light beam into penetrating light and reflected light; a first photodetector being arranged so that the first photodetector detects the light penetrating though the polarization beam splitter; a second photodetector arranged so that the second photodetector detects the light reflected by the polarization beam splitter; and a signal processing device that measures the axial displacement of the probing needle based on the displacement information which is either a first output signal from the first photodetector or a second output signal from the second photodetector, and measures the voltage of the probing needle relative to the reference potential based on the voltage information which is a difference between the first output signal and the second output signal.

The second mode of the second aspect of the present invention further comprises: an optical microscope having a barrel, an objective lens attached to the barrel, coarse movable stage and a fine movable stage, on which the barrel mounted, mounted on the coarse movable stage; and a second holder, attached to the barrel, for holding the holder of the voltage & displacement sensitive probe with the axis of the probe vertically under the objective lens.

The third mode of the second aspect of the present invention further comprises: an optical microscope having a barrel, an objective lens attached to the barrel, coarse movable stage and a fine movable stage, on which the barrel mounted, mounted on the coarse movable stage; a second fine movable stage mounted on the coarse movable stage; and a second holder, attached to the second movable stage, for holding the holder of the voltage & displacement sensitive probe with the axis of the probe vertically under the objective lens.

The fourth mode of the second aspect of the present invention further comprises: an optical microscope having a barrel and an objective lens attached to the barrel; course movable stage; a fine movable stage, on which a sample is to be mounted, mounted on the coarse movable stage; and a second holder for holding the holder of the voltage and displacement sensitive probe with the axis of the probe vertically under the objective lens.

According to the third aspect of the present invention, there is provided a voltage and displacement measuring method, by using one of the above voltage and displacement measuring apparatus, comprising the steps of: observing the sample with the optical microscope by the reflected light from the sample through the transparent elastic film or between the beam portions in order to determine roughly a position of the probing needle relative to a voltage measuring point on the sample; driving the fine movable stage so that the probe approach relative to the sample until an amount of the axial displacement of the probing needle relative to the holder is detected; measuring a surface position of the sample in the axial direction of the probe based on the driving distance of the fine movable stage and the amount of the axial displacement of the probing needle relative to the holder; repeating the driving and measuring steps at a plurality of positions in the plane perpendicular to the axial direction of the probe so as to decide finely the voltage measuring point; driving the fine movable stage so that the tip of the probing needle comes close to or contacts to the voltage measuring point; and measuring a voltage at the tip of the probing needle by the voltage measuring means.

In the first mode of the third aspect of the present invention, the apparatus comprises further a second fine movable stage, to which the reflector is attached, for moving the reflector in the direction of reflection by the reflector, wherein after the step of contacting the probing needle, the second fine movable stage is driven and stopped when the displacement detection sensitivity has become the maximum.

Other and further objects, features and advantages of the present invention will become apparent from the following description of the preferred embodiments when the same is read in conjunction with the accompanying drawings.

DESCRIPTION OF THE PREFERRED EMBODIMENTS

Figure 1:
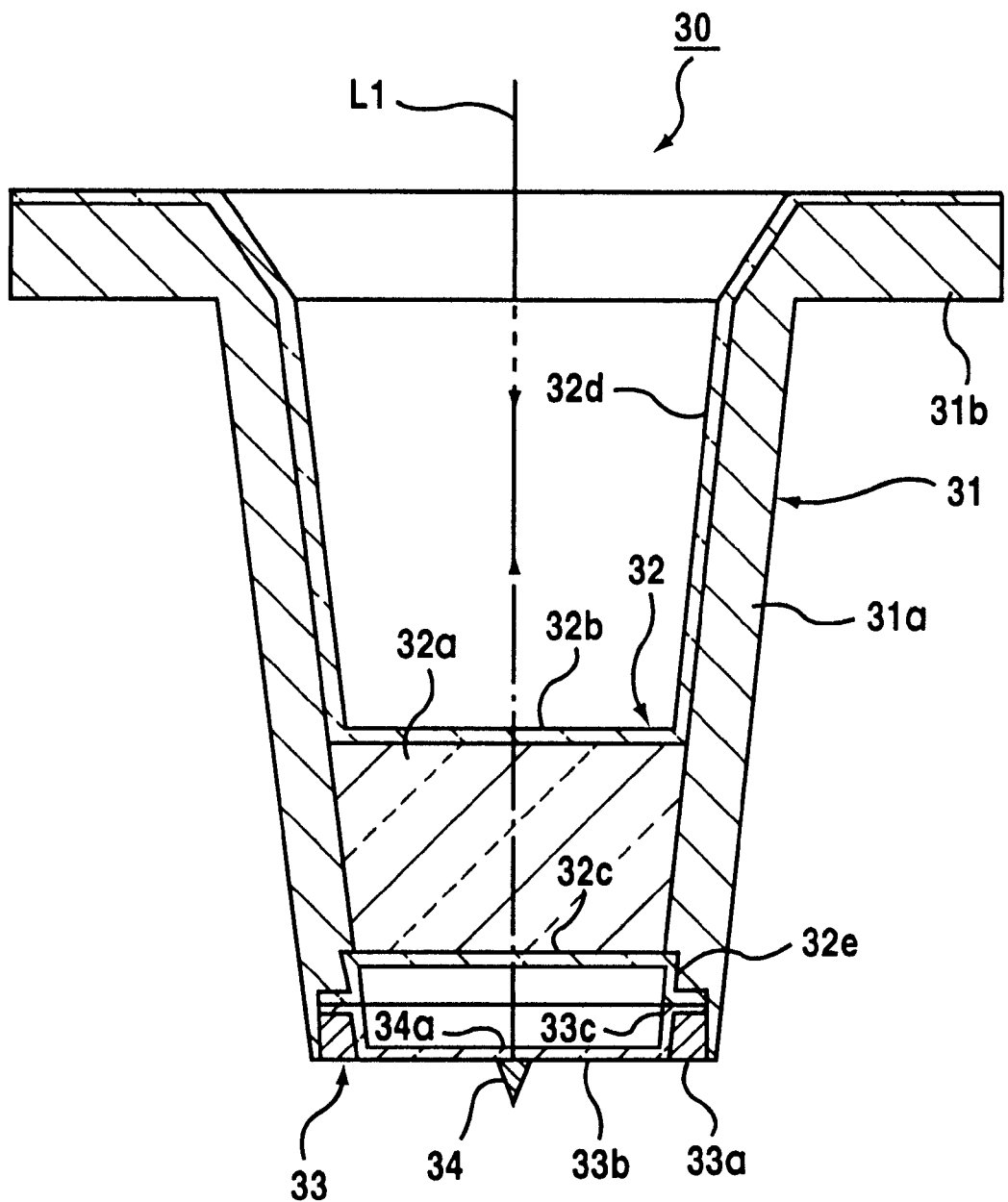
FIG. 1 is an axial sectional view of the voltage and displacement sensitive probe in the first embodiment according to present invention.

Referring now to the drawings, wherein like reference characters designate like or corresponding parts throughout several views, embodiments of the present invention are described below.

First Embodiment

FIG. 1 shows an axial section of the voltage and displacement sensitive probe 30 in the first embodiment. This probe 30 is symmetrical with respect to any plane through the axis thereof.

The holder 31 comprises a cylinder 31a whose diameter increases toward the upper end from the bottom and the flange 31b which protrudes toward the outside in the direction of the radius from the upper end of the cylinder 31a. The voltage/phase difference conversion device 32 is fitted in the holder 31.

The device 32 consists of an electro-optic crystal 32a whose upper and lower surfaces are parallel to each other, the electrically conductive transparent film 32b which is adhered to the upper surface and the electrically conductive transparent film 32c which is adhered to the lower surface. The electro-optic crystal 32a, corresponding to the voltage between the electrically conductive transparent film 32b and 32c, makes a phase difference between the two components of linearly polarized light entering the upper surface at a right angle whose electric vector vibration directions are perpendicular to each other. The size of the electro-optic crystal 32a may be, for example, 1 mm in diameter and 1 mm in height.

The electrically conductive transparent film 32d is adhered to the inner surface of the holder 31 in order to apply ground potential from the outside as a reference potential to the electrically conductive transparent film 32b, and the lower end of the electrically conductive transparent film 32d is continuous with the circumferential edge of the electrically conductive transparent film 32b. The electrically conductive transparent films 32b and 32d are formed, for example, by ITO deposition with sputtering with the electro-optic crystal 32a fitted inside the holder 31.

The probing needle supporter 33 is fitted inside at the lower end of the holder 31. The probing needle supporter 33 consists of the frame 33a, the electrically conductive transparent film 33b whose circumferential edge is bonded to the frame 33a and the electrically conductive transparent film 33c which is continuous with the electrically conductive transparent film 33b. The size of the electrically conductive transparent film 33b may be, for example, 1 mm in diameter and 0.5 μm thick.

The electrically conductive transparent film 32e is adhered to the inner surface of the lower end of the holder 31 in order to connect between the electrically conductive transparent films 33c and 32c, and the upper end of the electrically conductive transparent film 32e is continuous with the circumferential edge of the electrically conductive transparent film 32c. The electrically conductive transparent films 32c and 32e are formed, for example, by ITO deposition with sputtering, with the electro-optic crystal 32a fitted inside the holder 31.

Figure 2A:
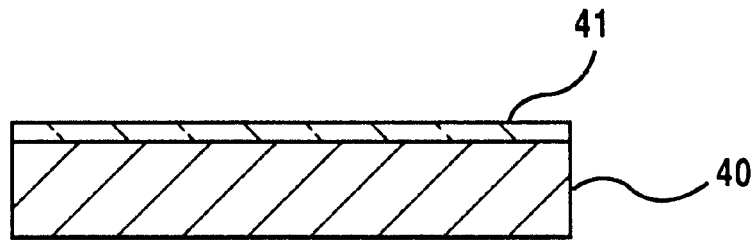
FIGS. 2A–2C are process diagrams of the production of the probing needle supporter shown in FIG. 1.
Figure 2B:
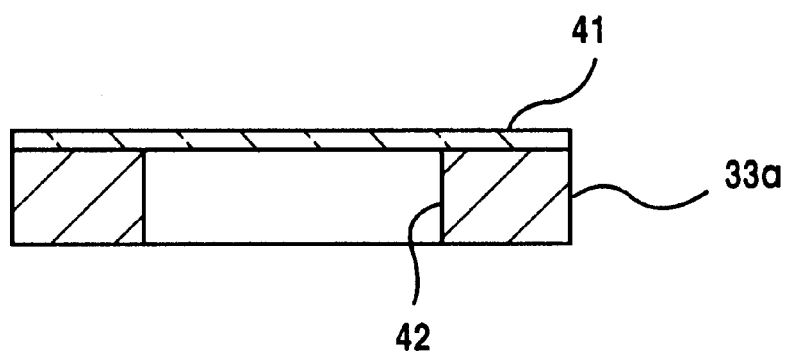
Figure 2C:
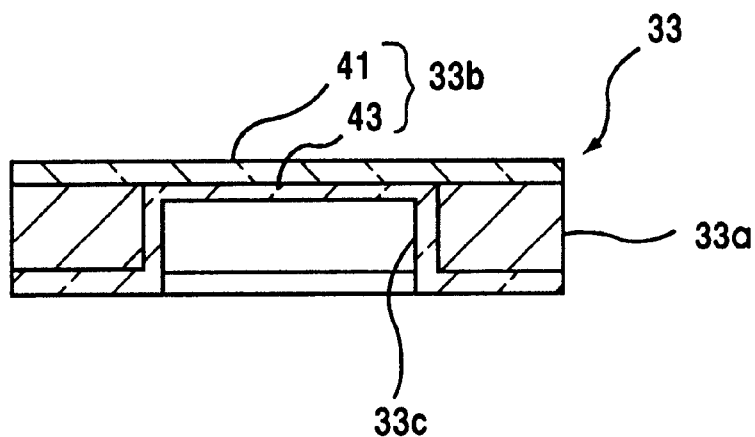

An example of a production process for the probing needle supporter 33 is shown in FIGS. 2A–2C.

First, as shown in FIG. 2(A), the electrically conductive transparent film 41 is adhered to the substrate 40 by sputtering. Then as shown in FIG. 2(B) an opening 42 is formed in the substrate by etching. Next, as shown in FIG. 2(C), ITO deposition is adhered to the frame 33a and the electrically conductive transparent film 41 by sputtering from the opposite side of the electrically conductive transparent film 41.

Figure 3:
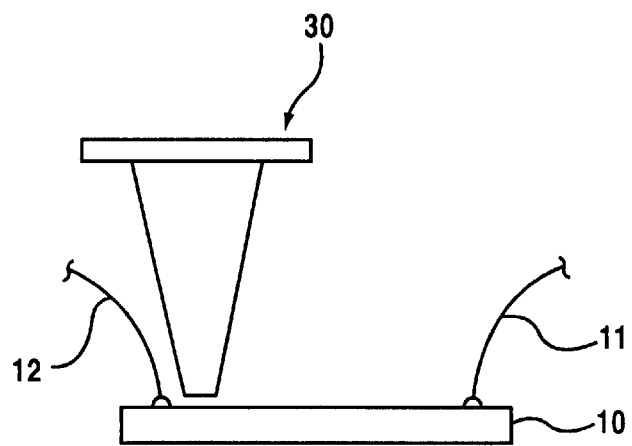
FIG. 3 shows the operating state of the voltage and displacement sensitive probe in FIG. 1.

In FIG. 1, the bottom surface of the probing needle 34 is bonded to the central area of the lower surface of the electrically conductive transparent film 33b. The size of the probing needle 34 may be, for example, 10 μm in diameter at the bottom surface and 10 μm in height. The probing needle 34 connects with the electrically conductive transparent film 32c via the electrically conductive transparent films 33b, 33c and 32e. As a result, when the tip of the probing needle 34 contacts or approaches a sample such as a semiconductor chip 10 as shown in FIG. 3, the potential at the tip of the probing needle 34 is supplied to the electrically conductive transparent film 32c. This potential will have a value that corresponds to the potential at the measuring point when the tip of the probing needle 34 approaches the surface of the sample and also corresponds to the capacitance between the measuring point and the tip of the probing needle 34.

In FIG. 1, the bottom surface of the probing needle 34 constitutes the reflective surface 34a and when the light beam L1 enters along the axis of the voltage and displacement sensitive probe 30, it travels through the voltage/phase difference conversion element 32 and the electrically conductive transparent film 33b. It is then reflected by the reflective surface 34a and travels through the electrically conductive transparent film 33b and the voltage/phase-difference conversion element 32 again in the reverse direction. By detecting the change in the length of this light path, the displacement of the probing needle 34 relative to the holder 31, that is, the height of the contact or close point on the sample from a reference position can be detected.

Figure 4:
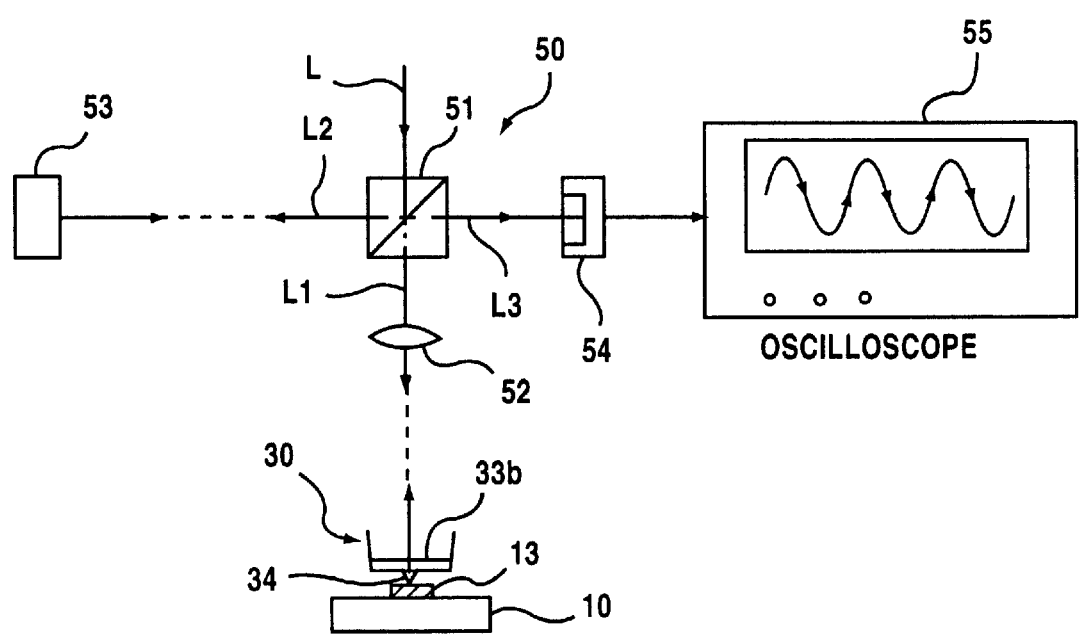
FIG. 4 shows the principle of displacement measurement applying the voltage and displacement sensitive probe in FIG. 1.

FIG. 4 shows the principle of displacement measurement when the voltage and displacement sensitive probe 30 is used. In FIG. 4, the tip of the needle 34 is in contact with the wire 13 on the semiconductor chip 10.

The Michelson interferometer 50 consists of the beam splitter 51 that splits the linearly polarized light beam L into the penetrating light beam L1 and the reflected light beam L2, the converging lens 52 for converging the light beam L1 on to the bottom surface of the probing needle 34, the mirror 53 for reflecting the beam L2 so that it will travel in the reverse direction, and the photodetector 54 for detecting the interfered light beam L3 consisting of the reflected light from the mirror 53 which has passed through the beam splitter 51 and the reflected light from the probing needle 34 that has also been reflected by the beam splitter 51. When the output from the photodetector 54 is supplied to the oscilloscope 55, the sine curve as shown in FIG. 4 is obtained on the screen display of the oscilloscope 55 during the process in which the voltage & displacement sensitive probe 30 is lowered so as to contact or approach the probing needle 34 to the wire 13. By counting a wave cycle of this sine curve, the displacement of the probing needle 34 can be detected with an accuracy of about half the wavelength and by detecting the phase of the waveform, this displacement can be detected with even high accuracy.

Figure 5:
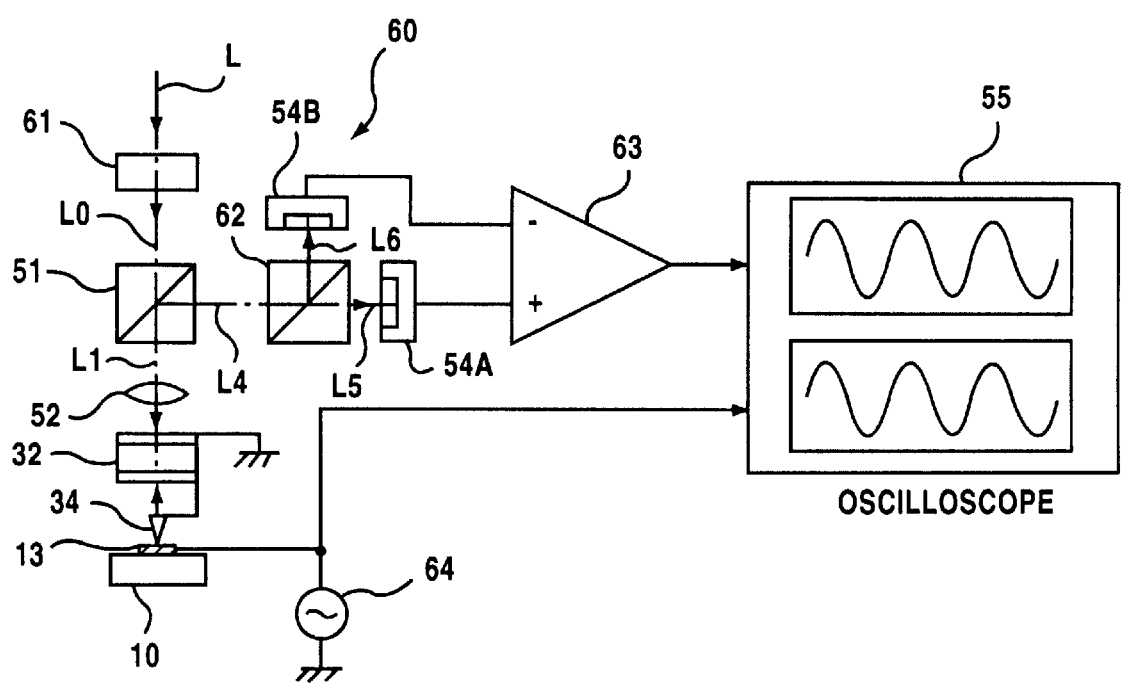
FIG. 5 shows the principle of voltage measurement applying the voltage and displacement sensitive probe in FIG. 1.

In FIG. 1, with the light beam L1 passing though the electro-optic crystal 32a twice, the voltage at the tip of the probing needle 34 can be measured by detecting the phase difference between the two components of linearly polarized light whose electric vector vibration directions are perpendicular to each other. The principle of this measurement is shown in FIG. 5.

The phase difference detecting device 60 consists of the quarter-wave plate 61 that converts the linearly polarized light beam L to the circularly polarized light beam L0, the beam splitter 51 into which the circularly polarized light beam L0 enters, the converging lens 52 for converging the penetrating light beam L1 from the beam splitter 51 on the bottom surface of the probing needle 34, the polarization beam splitter 62 into which the light beam L4 reflected by the beam splitter 51, the photodetectors 54A and 54B which detect the light beam L5 penetrating through the polarization beam splitter 62 and the light beam L6 reflected by the polarization beam splitter 62 respectively, and the differential amplifier 63 that amplifies the difference between the outputs from the photodetector 54A and 54B. When the output from the AC voltage source 64 is supplied to the wire 13 which is in contact with the probing needle 34, and the outputs from the AC voltage source 64 and the differential amplifier 63 are supplied to the oscilloscope 55, the voltage waveform of the output from the AC voltage source 64 and the differential amplifier 63, as shown in FIG. 5, are obtained on the screen display of the oscilloscope 55. Based upon the relationship between the two waveforms, the voltage of the wire 13 can be measured.

Figure 6:
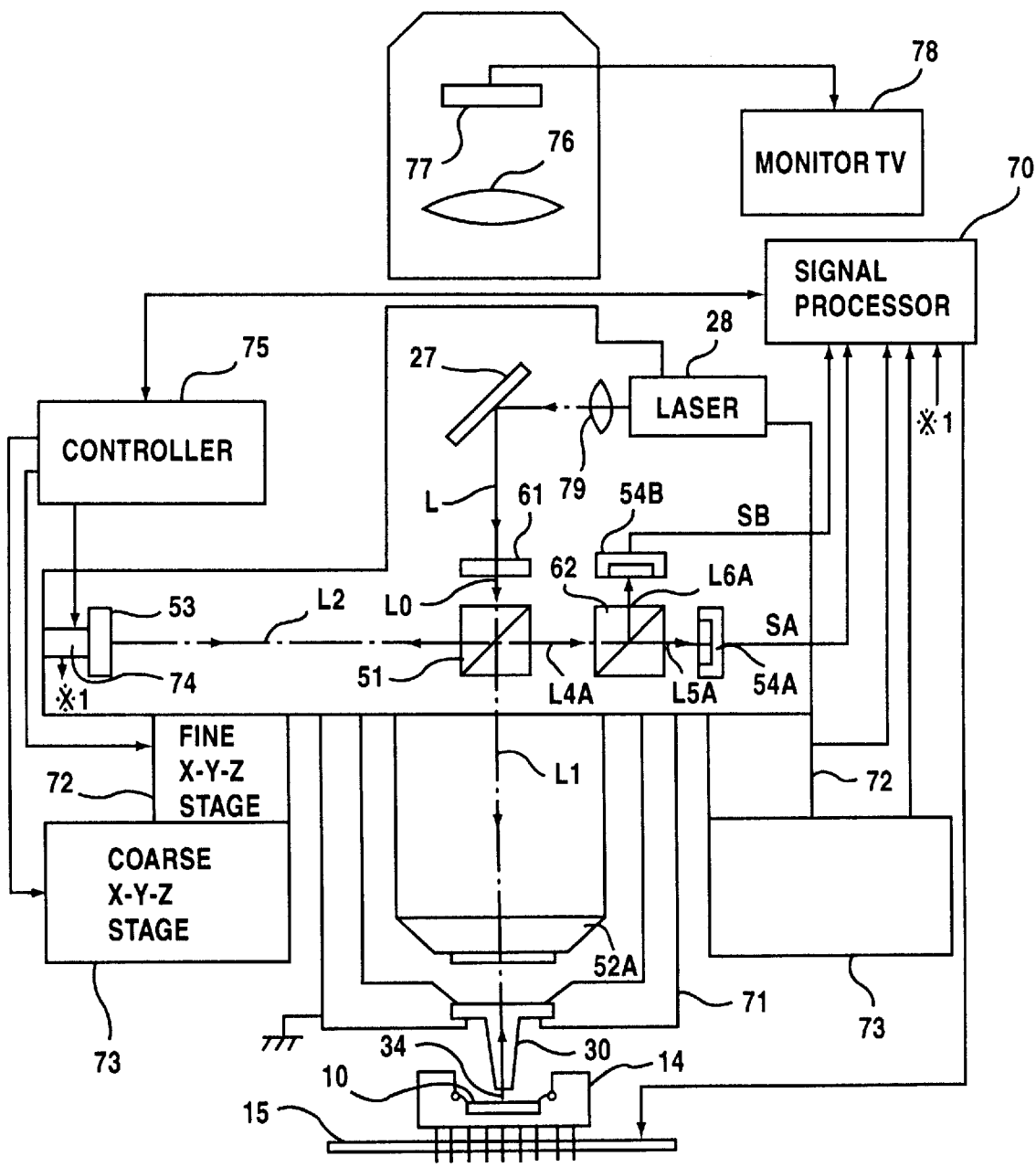
FIG. 6 shows a voltage & displacement measuring apparatus mounted on an optical microscope.

In FIG. 1, by placing the voltage and displacement sensitive probe 30 on the sample side of the objective lens of a optical microscope and by observing the semiconductor chip 10 with the optical microscope through the voltage/phase difference conversion element 32 and the electrically conductive transparent film 33b, the approximate position of the wiring on the semiconductor chip can be determined. The configuration of an apparatus, that applies the voltage and displacement sensitive probe 30 and an apparatus applying principles of measurement shown in FIGS. 4 and 5, mounted on an optical microscope, is shown in FIG. 6.

The semiconductor chip 10 is mounted via the package 14 on the circuit board 15 for testing. Test signals are supplied via the circuit board 15 and the package 14 to the semiconductor chip 10 from the signal processing device 70.

The voltage and displacement sensitive probe 30 is held by the probe holder 71 in such a manner that its optical axis is aligned with the optical axis of the objective lens 52A, and the probe holder 71 is coupled to a microscopic lens barrel. The microscopic lens barrel is supported via the fine movable X-Y-Z stage 72 by the coarse movable X-Y-Z stage 73.

The fine movable X-Y-Z stage 72 is structured with piezoelectric actuator and is capable of determining position with an accuracy of $1/100$ to $1/1000$ $\mu$m and, at the same time, it is capable of scanning in one direction through a range of several tens of $\mu$m. As a result, with only the fine movable X-Y stage 72c and the fine movable Z stage 72d, a wiring pattern with a width and thickness of approximately 1 $\mu$m on the semiconductor chip 10 can be scanned in detail and over a sufficiently large range. When scanning the voltage and displacement sensitive probe 30C over a minimal range with the fine movable X-Y-Z stage 72, the coarse movable X-Y-Z stage 73 should be stopped.

The mirror 53 is bonded to one end of the fine movable X stage 74 whose length in the direction of the reflected light beam L2 can be fine adjusted. The other end of the fine movable X stage 74 is bonded to a surface which is an integral part of the microscopic lens barrel. The position signals from the fine movable X-Y-Z stage 72, the coarse movable X-Y-Z stage 73 and the fine movable X stage 74 are supplied to the signal processing device 70. The controller 75 uses these position signals as feedback signals to drive the fine movable X-Y-Z stage 72, the coarse movable X-Y-Z stage 73 and the fine movable X stage 74.

The image that is formed by the objective lens 52A is then picked up through the pick-up lens 76 by the CCD image sensor 77 and its image is displayed on the monitor TV 78. The objective lens 52A also functions as the converging lens 52 as shown in FIGS. 4 and 5.

The linearly polarized light emitted by the laser 28 is made parallel by the collimator lens 79, reflected by the mirror 27 and then enters the quarter-wave plate 61. The quarter-wave plate 61, the beam splitter 51, the polarization beam splitter 62 and the photodetectors 54A and 54B are identical to those shown in FIG. 5 and the mirror 53 is identical to that shown in FIG. 4.

Regarding the measurement of displacement in the direction of height, as is obvious when compared to the structure shown in FIG. 4, the output SP which is either the output SA of the photodetector 54A or the output SB of the photodetector 54B corresponds to the output of the photodetector 54 in FIG. 4. The signal processing device 70 measures the displacement of the probing needle 34 in the direction of height based upon this SP. The details of the concave-convex pattern on the semiconductor chip 10 can be obtained based on the position signals from the fine movable X-Y-Z stage 72 and the coarse movable X-Y-Z stage 73 and the displacement of the probing needle 34 obtained from the SP.

As for the measurement of the voltage, it differs from the case in FIG. 5 in that the reflected light from the mirror 53 is included in the interference light beam L4A. However, since the reflected light from the mirror 53 is circularly polarized and the intensities of the two light beams are equal after being divided into two by the polarization beam splitter 62, the difference SM between the output SA of the photodetector 54A and the output SB of the photodetector 54B is not affected. The signal processing device 70 detects the voltage at the tip of the probing needle 34 based upon the difference SM.

The fine movable X-Y-Z stage 72 is driven to lower the voltage and displacement measuring probe 30 from the point over the wire which is the object of the potential measurement on the semiconductor chip 10. After change in the SP is detected and further the change become equal to the set value, namely, after the probing needle 34 has contacted the wire on the semiconductor chip 10 or has come close to it, the lowering of the fine movable X-Y-Z stage 72 is stopped. Then the position of tip of the proving needle is found based on the driving distance of the fine movable X-Y-Z stage and the value of change in the SP.

In order to prevent the probing needle 34 from damaging the surface of the semiconductor chip 10 while the voltage & displacement sensitive probe 30 scans within the X-Y plane, the following measures may be taken: The height of the surface of the ship 10 at the time when the tip of the probing needle 34 has come close to or has contacted to the surface of the chip 10 is detected in such a way as described above, and the voltage & displacement sensitive probe 30 is driven in the direction +Z (upward) by a specific distance d. Next, it is driven within the X-Y plane and then driven in the direction −Z (downward) by the specific distance d. This sequence of operations is performed repeatedly to scan the surface of the semiconductor chip 10.

With the scanning described above, the voltage measuring point can be ascertained accurately.

Next, the fine movable X-Y-Z stage 72 is driven so that the tip of the probing needle 34 is close to or contacts to the voltage measuring point. It is preferable to stop the lowering of the fine movable X-Y-Z stage 72 when the SP has changed several cycles, for example, 10 cycles because the contact of the probing needle 34 with the semiconductor chip 10 becomes reliable.

Then the fine movable X stage 74 is driven and stopped when the SP has reached the middle value between the maximum and the minimum values. With this, the displacement detection sensitivity is set to the maximum.

Then, the test signal is supplied to the semiconductor chip 10 to perform voltage measuring at this position.

With the voltage and displacement measuring apparatus that is structured as described above, the voltage and the displacement measurements can be made with a single optical system that applies on laser 28. Thus, the structure and the required adjustments can be simplified compared to the prior art.

FIG. 3 shows the state in which the voltage and displacement sensitive probe 30 is used on the semiconductor chip 10. As can be clearly seen in FIG. 3, with the voltage and displacement sensitive probe 30 in the first embodiment according to the present invention, scanning can be performed on the semiconductor chip 10 without interfering with the bonding wires 11 and 12.

Figure 7:
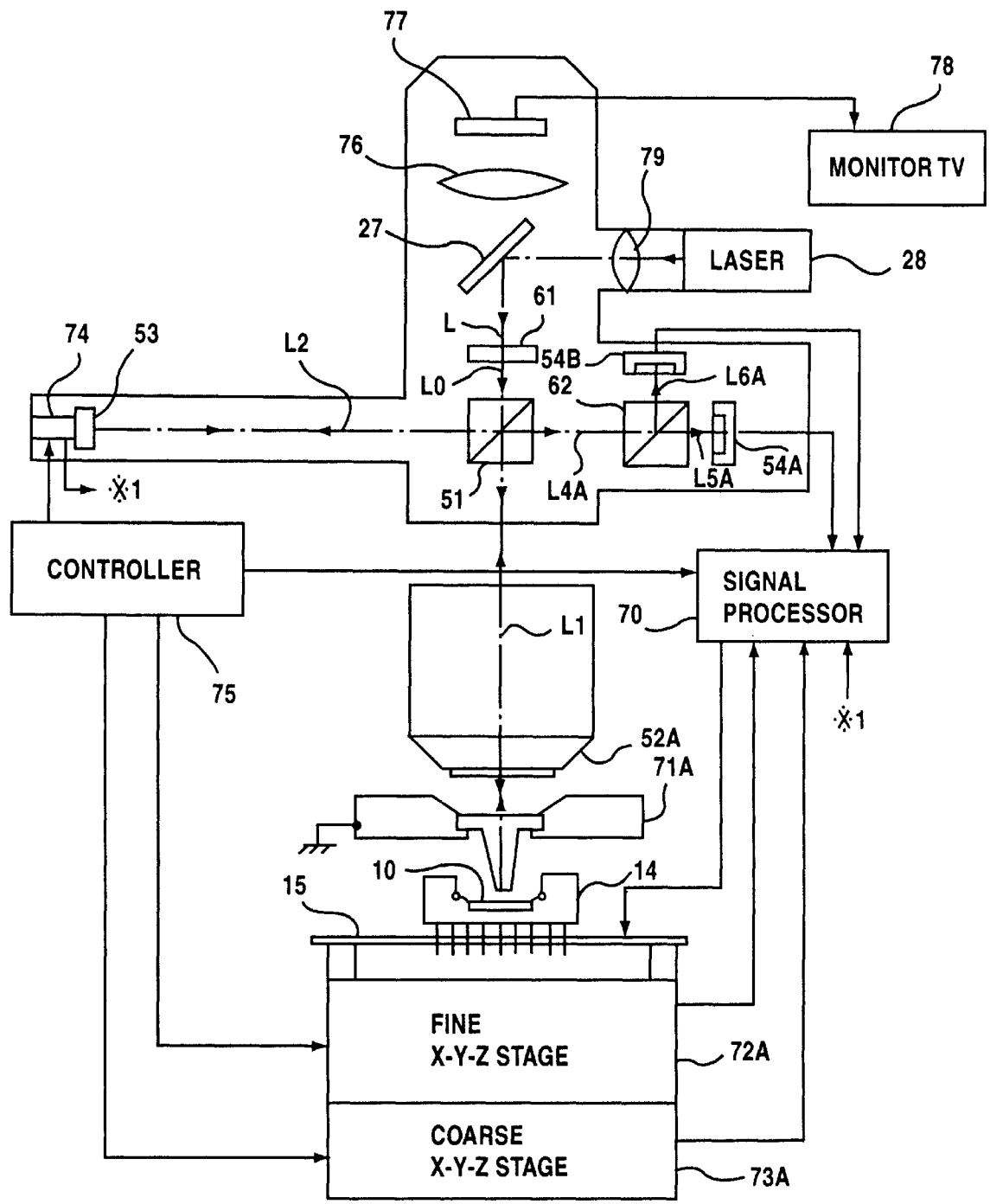
FIG. 7 shows another configuration of the voltage and displacement measuring apparatus mounted on an optical microscope.

FIG. 7 shows the voltage and displacement measuring apparatus installed in an optical microscope with a different configuration. This device is structured so that the semiconductor chip 10 is moved instead of the optical microscope. In other words, the circuit board 15 is mounted via the fine movable X-Y-Z stage 72A on the the coarse movable X-Y-Z stage 73. All other aspects are identical to the case shown in FIG. 6.

With this structure, since the sample, whose inertia is small in comparison to that of the microscope, can be driven at high speed, the time required for measuring can be reduced.

Second Embodiment

Figure 8:
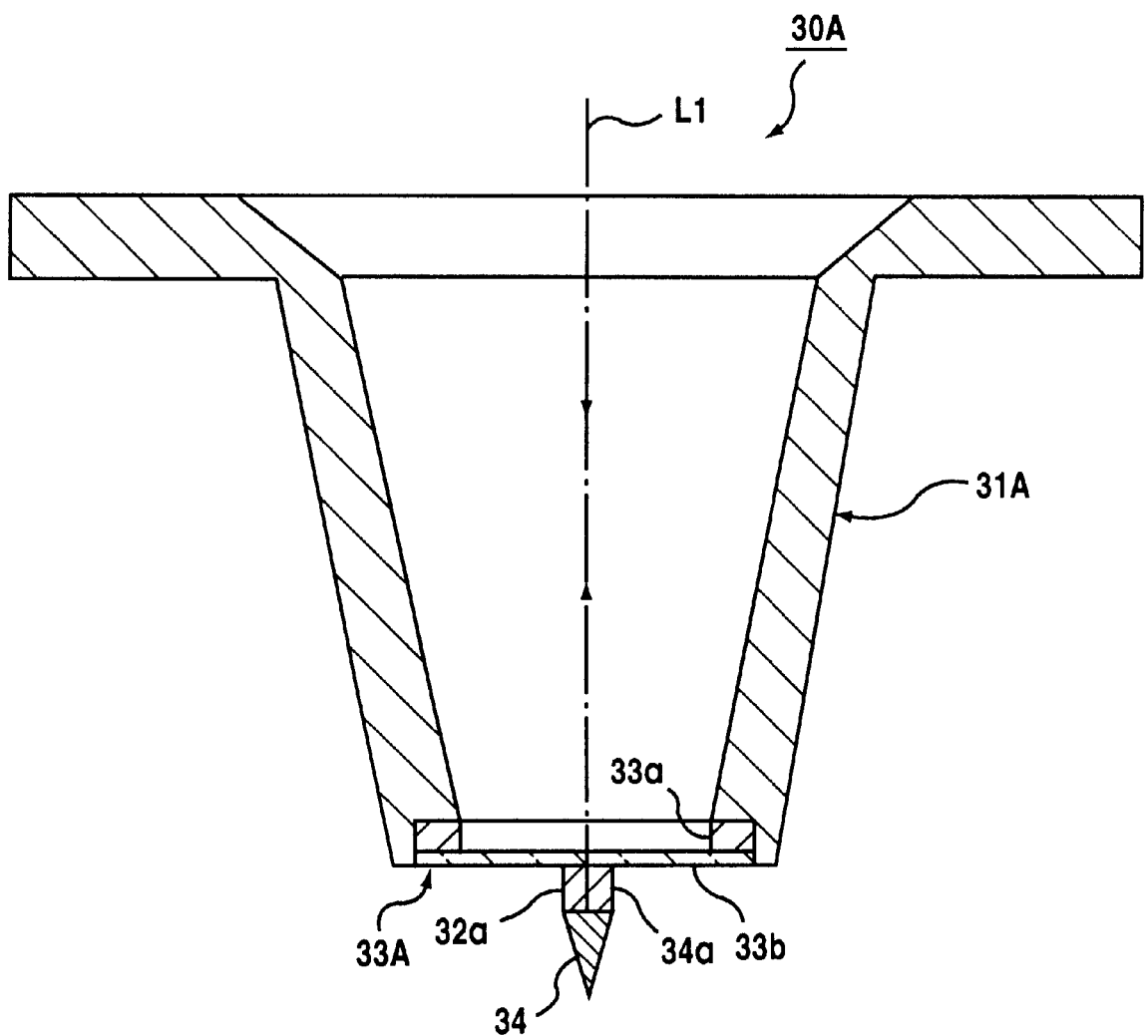
FIG. 8 is an axial sectional view of the voltage and displacement sensitive probe in the second embodiment according to present invention.

FIG. 8 shows an axial sectional view of the voltage & displacement sensitive probe 30A in the second embodiment. This probe 30A is symmetrical with respect to any plane through the axis thereof.

The upper surface of the electro-optic crystal 32a is bonded to the central portion of the lower surface of the electrically conductive transparent film 33b and the bottom surface of the probing needle 34 is bonded to the lower surface of the electro-optic crystal 32a. The electro-optic crystal 32a may be, for example, 10 $\mu$m in diameter and 10 $\mu$m in height.

The electrically conductive transparent film 33b and the probing needle 34 form a pair of electrodes for the electro-optic crystal 32a. The holder 31A is structured with an electrically conductive material, which is connected with the electrically conductive transparent film 33b.

Accordingly, the structure of the voltage & displacement sensitive probe 30A is simpler than that of the voltage and displacement sensitive probe shown in FIG. 1.

All other aspects are identical to those in the first embodiment described earlier.

Third Embodiment

Figure 9A:
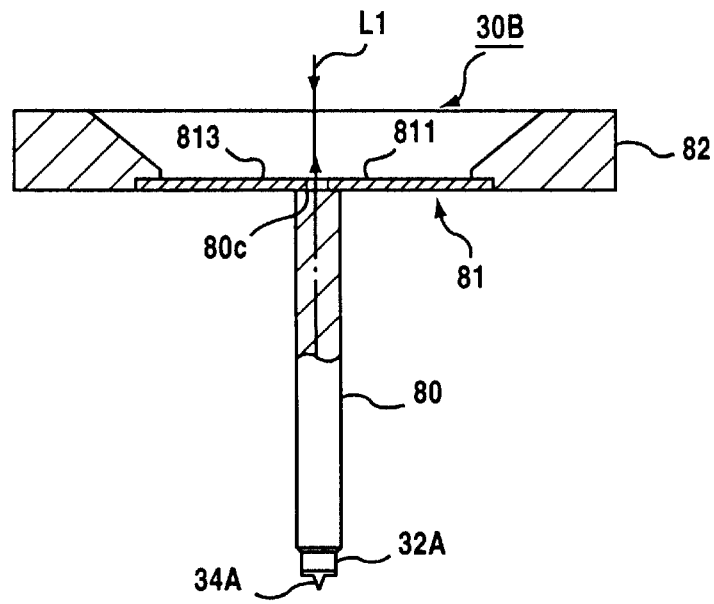
FIG. 9A is a partial cutaway view of the voltage and displacement sensitive probe in the third embodiment.

FIG. 9A shows a partial cutaway through the axis of the voltage & displacement sensitive probe 30B in the third embodiment. This probe 30B is symmetrical with respect to four planes through the axis thereof.

Figure 9B:
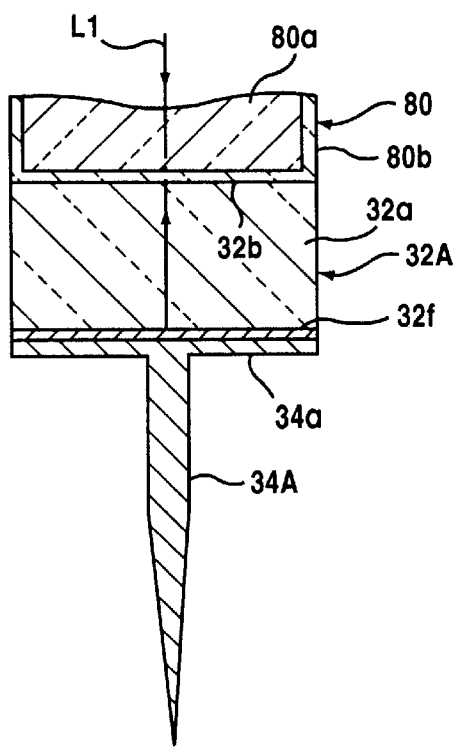
FIG. 9B is an enlarged axial sectional view of the lower portion of FIG. 9A.

In the rod 80, as shown in FIG. 9B, the electrically conductive transparent films 80b and 32b are adhered to the side surface and the bottom surface, respectively, of the solid transparent glass rod 80a and the anti-reflection film 80c is adhered to the upper surface of the rod 80. The size of the rod 80 may be, for example, 0.4 mm in diameter and 5 mm in length. The upper surface of the electro-optic crystal 32a is bonded to the lower surface of the rod 80. The reflective film 32f is adhered to the lower surface of the electro-optic crystal 32a and to this film 32f, the bottom surface of the probing needle 34A is bonded.

Figure 9C:
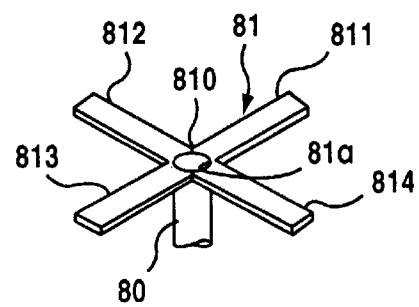
FIG. 9C is a perspective view of the cross beam and the upper portion of the rod in FIG. 9A.

As shown in FIG. 9C, the upper end of the rod 80 is bonded to the central portion 810 of the cross beam 81. The hole 81a, which is concentric with the rod 80, is formed in the central portion 810. The cross beam 81 is formed of the central portion 810 and band portions 811 and 814 that extend radially in four directions from the central portion 810. The tips of the band portions 811 to 814 are bonded to the bottom surface of the holder 82. Observation with an optical microscope is performed through the areas between the band portions 811 to 814, which are inside the holder 82.

The cross beam 81 is electrically conductive and elastic and may be formed of, for example, aluminum. Its size is 20 $\mu$m thick, 3 mm in diameter and 0.4 mm in width of each band portion 811 to 814. The probing needle 34A is, for example, 50 $\mu$m in diameter at the upper plate portion, and 400 $\mu$m in height. It is not restricted to a four cross beam scheme; a three or even two beam scheme is sufficient in some cases.

The electrically conductive transparent film 32b connects with the electrically conductive holder 82 via the electrically conductive transparent film 80b and the electrically conductive cross beam 81.

The light beam L1 that has entered the central area of the upper end of the rod 80 at a right angle, travels through the rod 80 and the electro-optic crystal 32a, is reflected by the reflective film 32f and then travels the same path in reverse.

All other aspects are identical to those in the first embodiment described earlier.

Fourth Embodiment

Figure 10A:
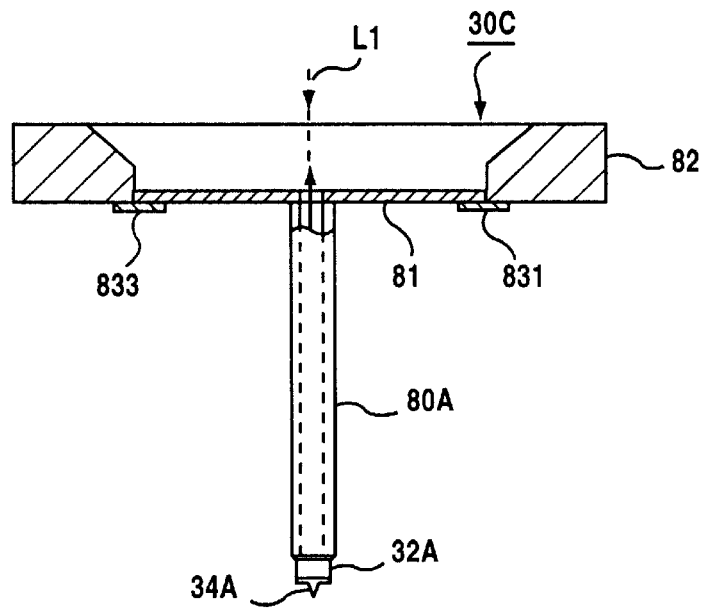
FIG. 10A is a partial cutaway view of the voltage and displacement sensitive probe in the fourth embodiment.
Figure 10B:
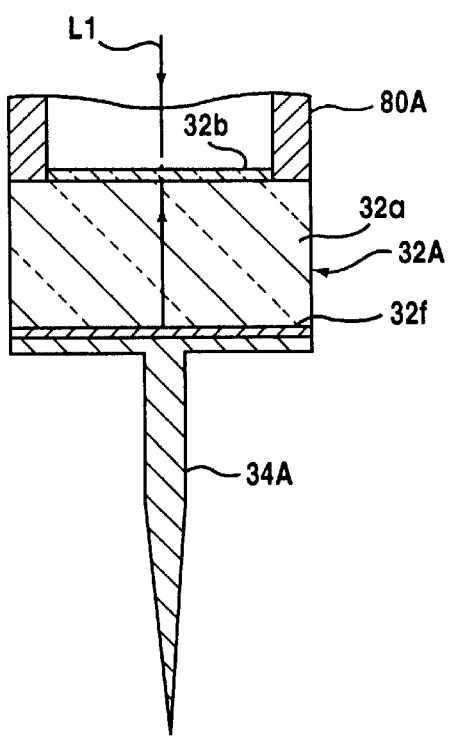
FIG. 10B is an enlarged axial sectional view of the lower portion of FIG. 10A
Figure 10C:
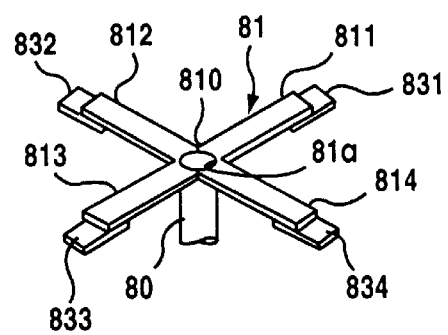
FIG. 10C is a perspective view of the cross beam and the upper portion of the rod in FIG. 10A.

FIG. 10A is a partial cutaway view of the voltage & displacement sensitive probe 30C in the fourth embodiment, FIG. 10B is an enlarged axial sectional view of the lower portion of FIG. 10A and FIG. 10C is a perspective view of the cross beam 81 and the upper portion of the rod 80A in FIG. 10A.

This probe 30C is symmetrical with respect to four planes through the axis thereof. The rod 80A is hollow. The tips of the band portions 811 to 814 of the cross beam 81 are bonded to the bottom surface of the holder 82 via the strain gauges 831 to 834. The electrically conductive transparent film 32b connects with the holder 82 via the electrically conductive rod 80A and the cross beam 81.

Figure 11:
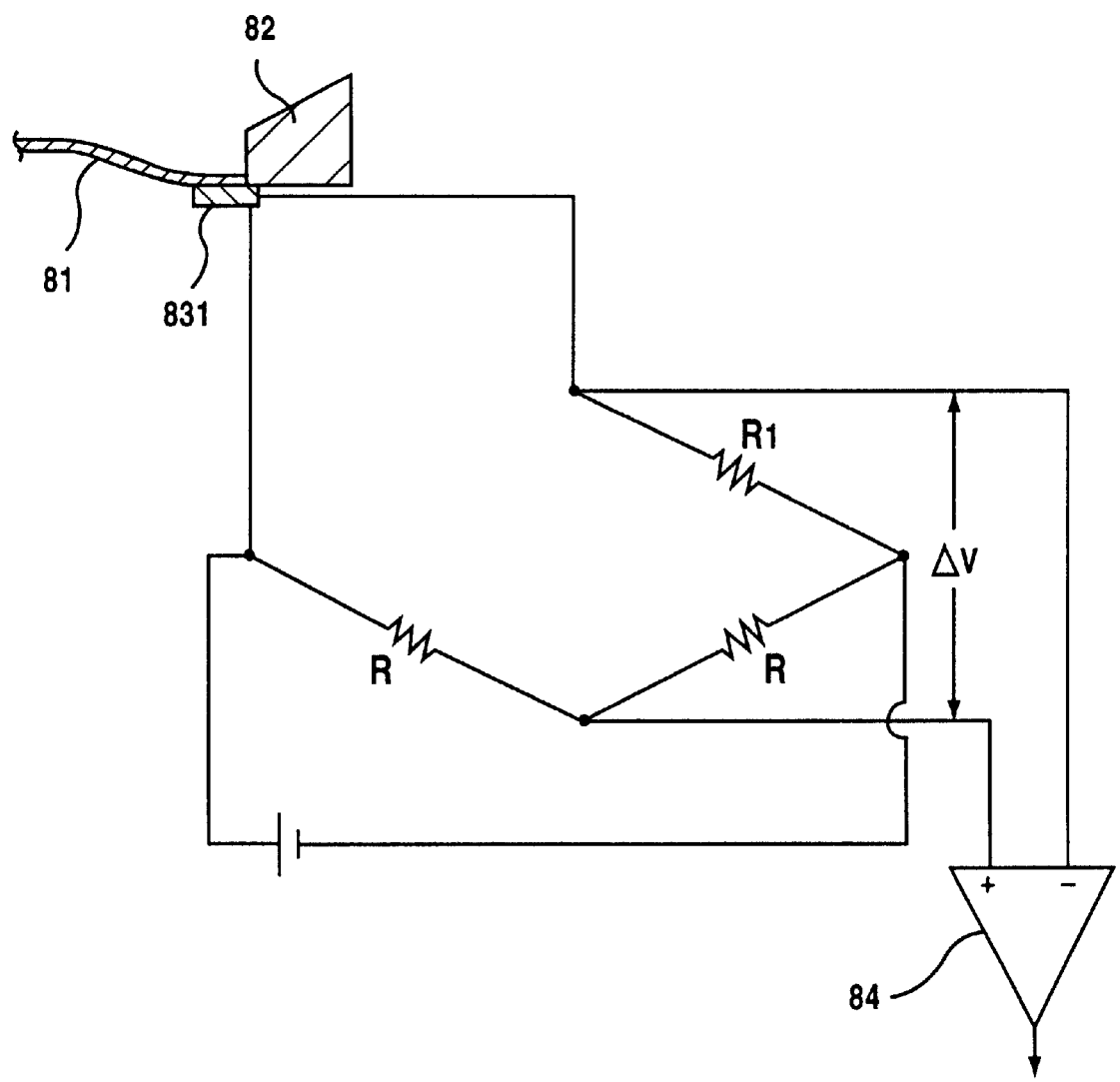
FIG. 11 is a strain/voltage conversion circuit diagram.

FIG. 11 shows the principle structure of a strain/voltage conversion circuit (Wheatstone bridge circuit) in the known art. This circuit converts the change in resistance of the strain gauge 831 into an unbalanced voltage $\Delta V$ and then amplifies it by the differential amplifier 84.

In case the cross beam 81 is made of aluminum and its size is 20 $\mu$m thick, 3 mm in diameter and 0.4 mm in width of each the band portion 811 to 814 as described above, if the central portion 810 is displaced in the direction of the height by 10 nanometers, the strain at the positions of the strain gauges 831 to 834 is approximately $0.2 \times 10^{-6}$. The gauge factor of the semiconductor strain gauge is approximately 100 and if the DC voltage applied to the bridge is 10 V, the change in the unbalanced voltage $\Delta V$ will be 0.1 mV. Since voltages can be measured with a resolution of approximately 10 $\mu$V, displacement in the height of the probing needle 34A can be measured with sufficient accuracy.

Figure 12:
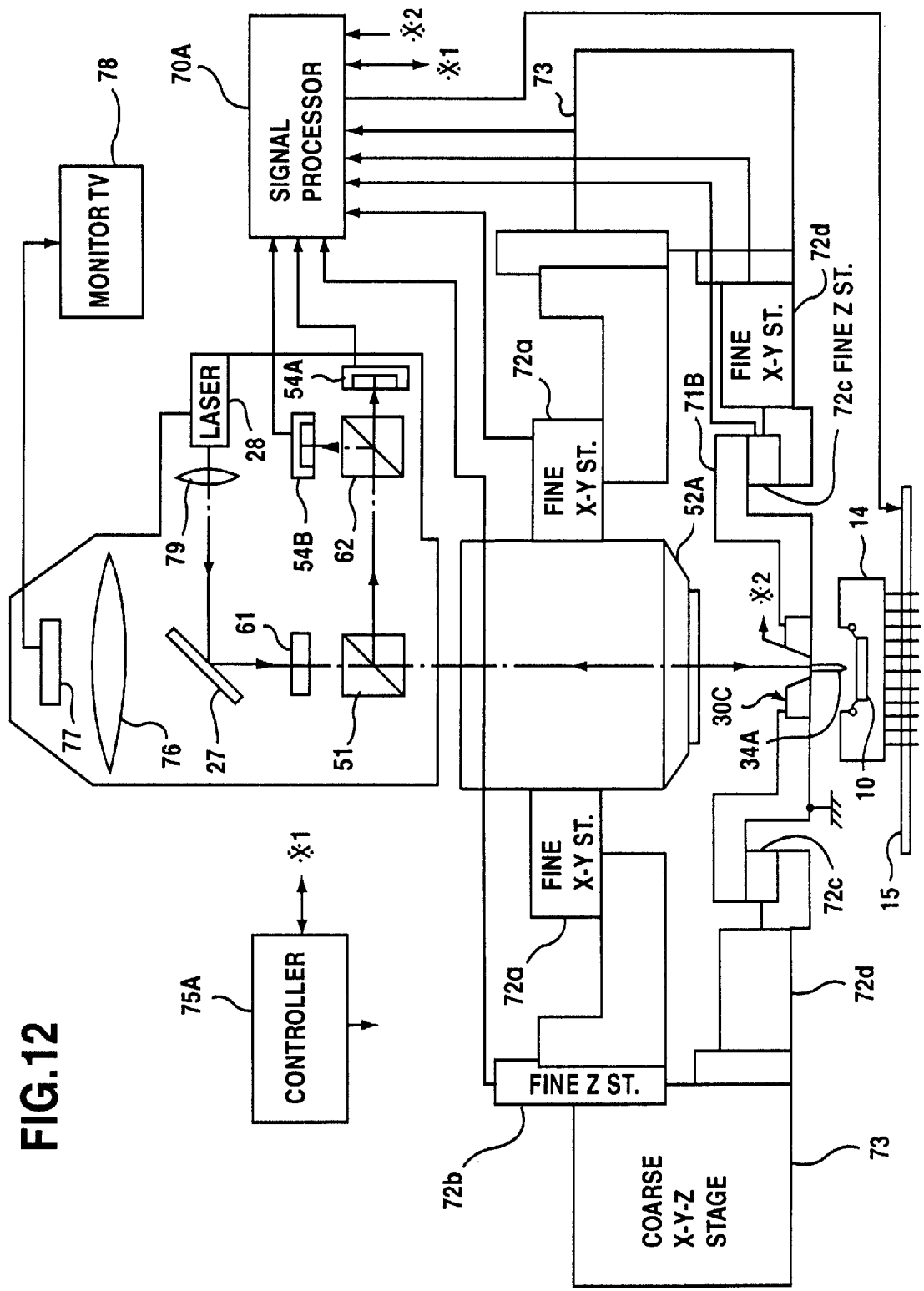
FIG. 12 shows a voltage and displacement measuring apparatus in the fourth embodiment according to the present invention mounted on an optical microscope.

FIG. 12 shows a structure in which the voltage & displacement sensitive probe 30A shown in FIG. 10 and the apparatus that applies the principles of measurement illustrated in FIGS. 5 and 11 are mounted in an optical microscope.

This structure does not use the mirror 53 and the fine movable X stage 74 shown in FIGS. 6 and 7. Instead, it has the strain/voltage conversion circuit internally provided in the signal processing device 70A to measure the displacement of the tip of the probing needle 34A in the direction of height.

Also, the probe holder 71B can make fine movable independent of the optical microscope. In other words, the microscopic lens barrel is mounted via the fine movable X-Y stage 72a and the fine movable Z stage 72b to the coarse movable X-Y-Z stage 73. Likewise, the probe holder 71B is mounted via the fine movable Z stage 72c and the fine movable X-Y stage 72d to the coarse movable X-Y-Z stage 73.

Since the total mass of the probe holder 71B and the voltage & displacement sensitive probe 30C is sufficiently small in comparison with the mass of the optical microscope, the scanning on the sample 10 can be at high speed, and as a result, the time required for measuring can be reduced.

All other aspects are identical to those in the first embodiment described earlier.

Fifth Embodiment

Figure 13:
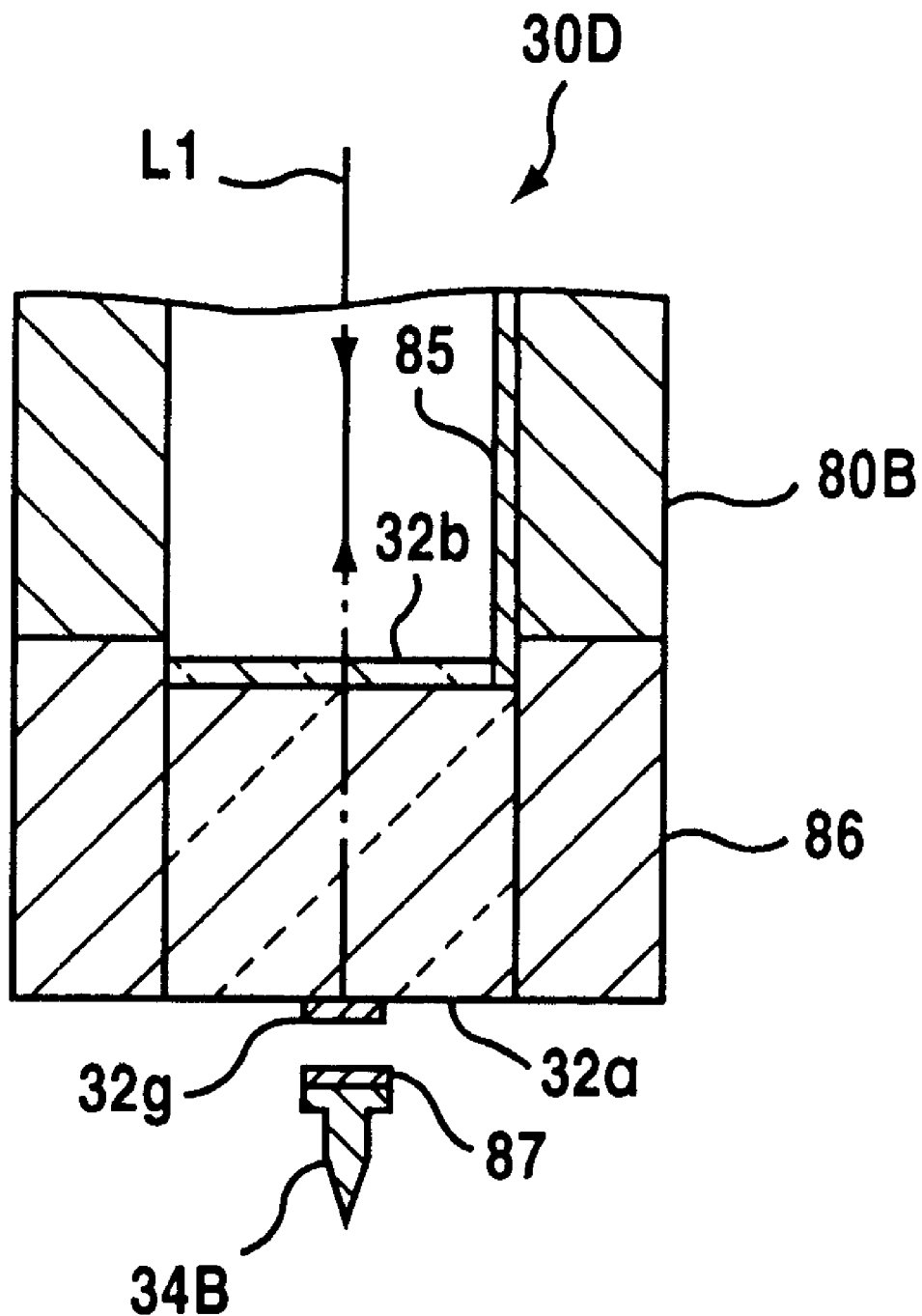
FIG. 13 is a fragmentary axial sectional view of the voltage and displacement sensitive probe in the fifth embodiment according to the present invention.

FIG. 13 shows a fragmentary axial sectional view of the lower portion of the voltage sensitive probe 30D in the fifth embodiment. This lower portion is symmetrical, excluding the lead wire 85, with respect to any plane through the axis thereof.

The lower end portion of the rod 80B is constituted by the magnetic cylinder 86 and the electro-optic crystal 32a is fitted inside the magnetic cylinder 86. The magnetic cylinder 86 may be formed of, for example, ferrite and its size is 1.5 mm in external diameter, 1 mm in internal diameter and 1.5 mm in height. The rod 80B is an insulator except the magnetic cylinder 86 and the lead wire 85 is formed on its inner wall. The lead wire 85 connects between the electrically conductive transparent film 32b and the cross beam 81 shown in FIG. 10A.

The reflective film 32g is adhered to the central portion of the bottom surface of the electro-optic crystal 32a and the reflective film 32g is an separate entity from the probing needle 34b. The magnetic film 87, which may be, for example, a ferrite film, is adhered to the bottom surface of the probing needle 34B. The structure of the voltage and displacement sensitive probe 30D is otherwise identical to that shown in FIG. 10.

Figure 14:
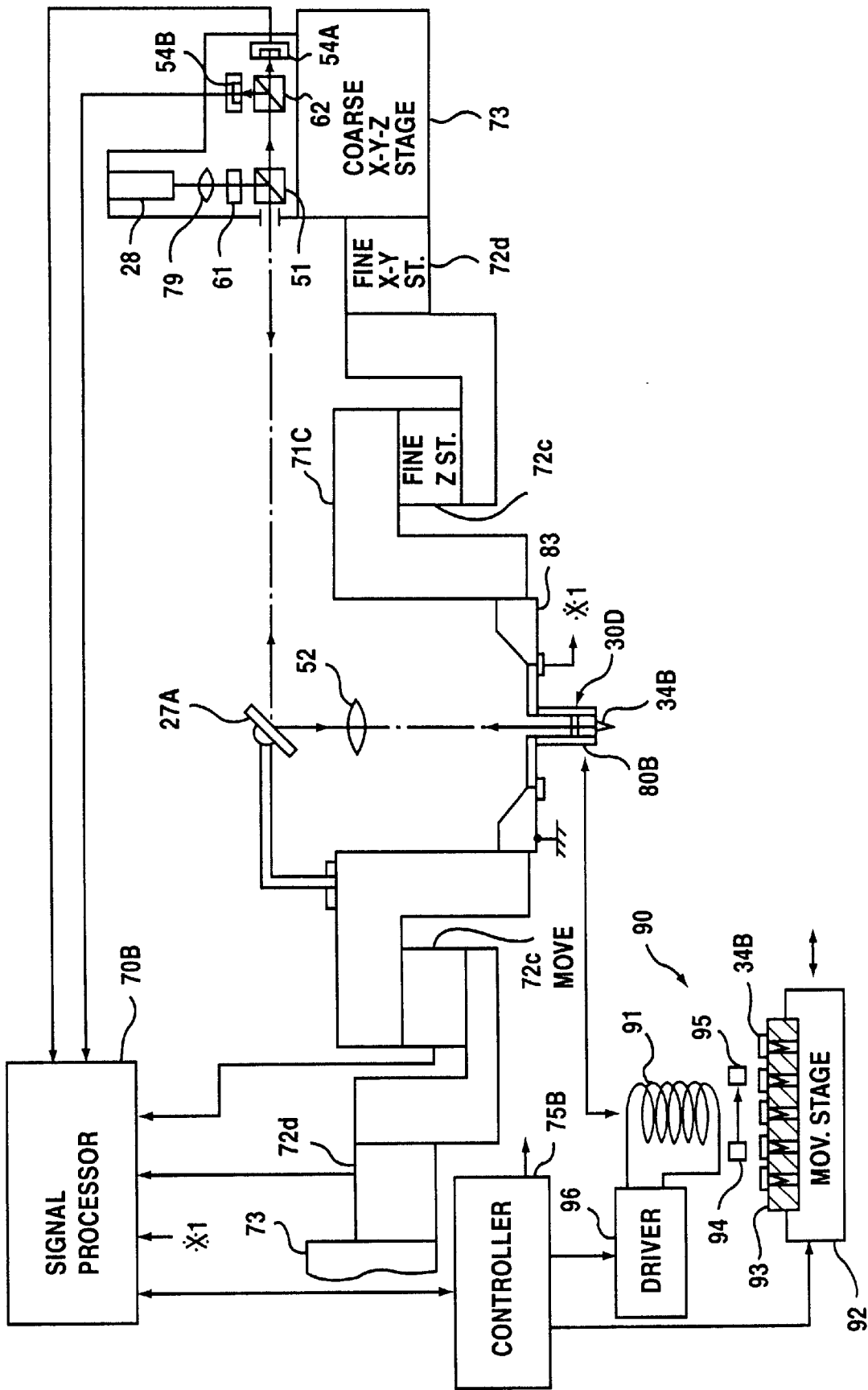
FIG. 14 shows a voltage and displacement measuring apparatus applying the probe shown in FIG. 13.

FIG. 14 shows the structure of the voltage and displacement measuring apparatus that applies the voltage and displacement sensitive probe 30D.

The voltage and displacement sensitive probe 30D is mounted on the probe holder 71C and, similar to the configuration shown in FIG. 12, it is supported via the fine movable X-Y stage 72c and the fine movable Z stage 72d on the coarse movable X-Y-Z stage 73. The probing needle replacing device 90 is provided on the outside of the light path of the probe 30D.

In the probing needle replacing device 90, the coil 91 is provided with its axis vertically. The inner diameter of the coil 91 is larger than that of the rod 80B. The movable stage 92 is provided under the coil 91 and the tray 93 is mounted on the movable stage 92. A plurality of holes are formed in the vertical direction in the tray 93 and the tip portions of the probing needles 34B are inserted to these holes to hold the probing needles 34B vertically. The light source 94 and photodetector 95 for detecting the lowering and raising of the probing needle 34B are provided facing each other between the tray 93 and the coil 91. The coil 91 is tuned on/off by the controller 75B via the driver 96, the movable stage 92 is driven by the controller 75B and the detection signal from the photodetector 95 is supplied to the controller 75B.

Figure 15:
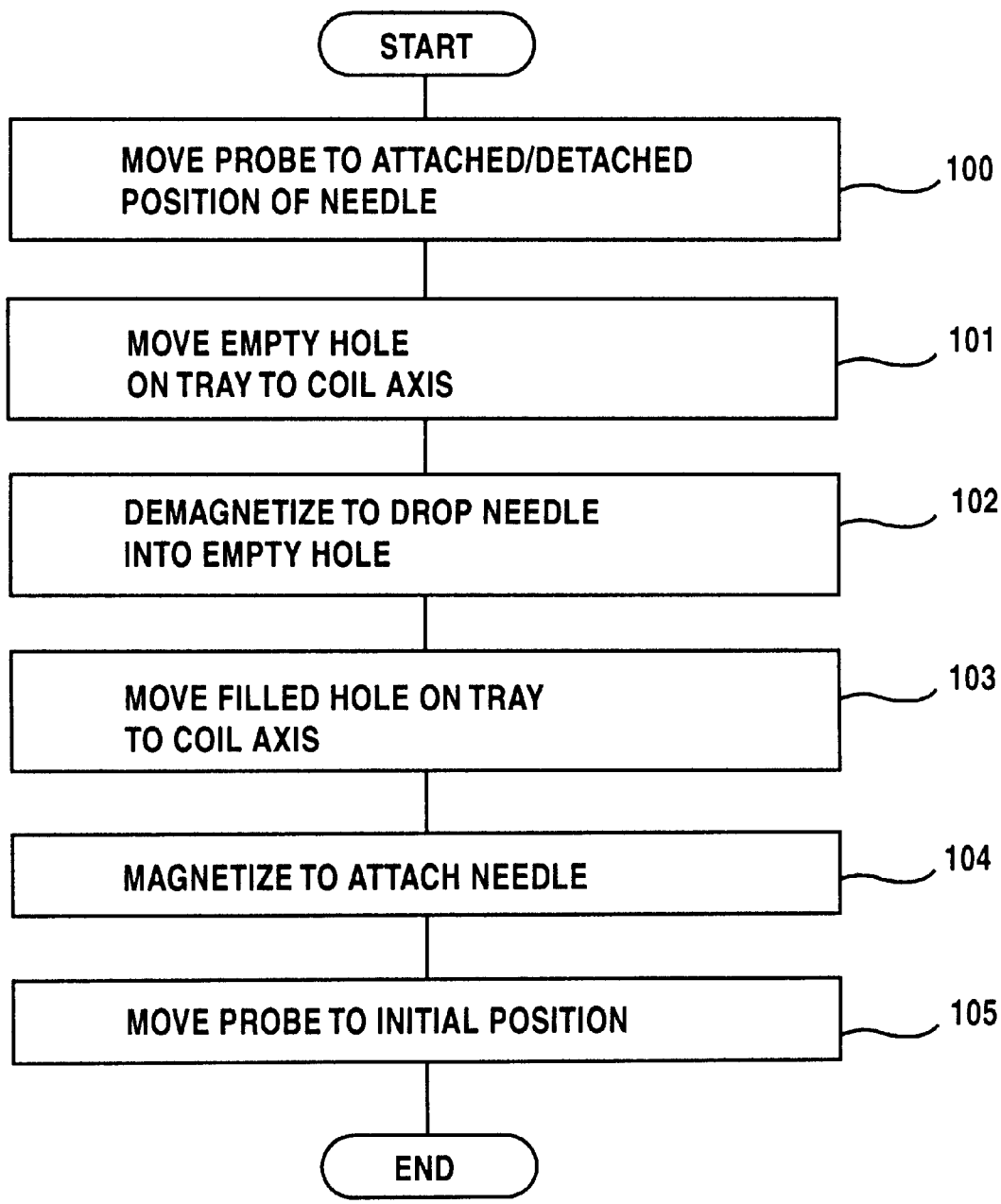
FIG. 15 is a flow chart showing the procedure with which the probing needle is replaced.

The following is the explanation of the replacement procedure for the probing needle 34B in reference to FIG. 15. Hereafter, numbers in parentheses indicate the step numbers in FIG. 15.

(100) The coarse movable X-Y-Z stage 73 is driven so that the optical axis of the voltage & displacement sensitive probe 30D is aligned with the axis of the coil 91. Then, the lower end portion of the voltage and displacement sensitive probe 30D is inserted within the coil 91.

(101) The movable stage 92 are driven so that the empty hole on the tray 93 is aligned with the axis of the coil 91.

(102) The magnetic cylinder is demagnetized by an electric current through the coil 91 and the lowering of the probing needle 34B is detected with the photodetector 95. With tis lowering, the probing needle 34B is held in the hole on the tray 93.

(103) The position of the hole in which the new probing needle 34B for replacement is inserted on the tray 93 is aligned on to the axis of the coil 91.

(104) The magnetic cylinder 86 is magnetized by an electric current to the coil 91 to bond the magnetic film 87 of the probing needle 34B to the reflective film 32g. After detecting the going-up probing needle 34B by the photodetector 95, the electric current to the coil 91 is turned off. Even when the electric current is turned off, the probing needle 34B remains adhered to the reflective film 32g with the residual magnetism of the magnetic cylinder 86.

(105) The coarse movable X-Y-Z stage 73 is driven to move the voltage and displacement sensitive probe 30D to the initial position.

In the manner described above, the probing needle 34B can be replaced automatically. The operator should observe the tip configuration of the used probing needle 34B and relate it to the degree of use.

It is understood that the magnetic film may be adhered to the reflective film 32g. Also, the probing needle 34B may be another one as shown FIG. 9B.

Sixth Embodiment

Figure 16:
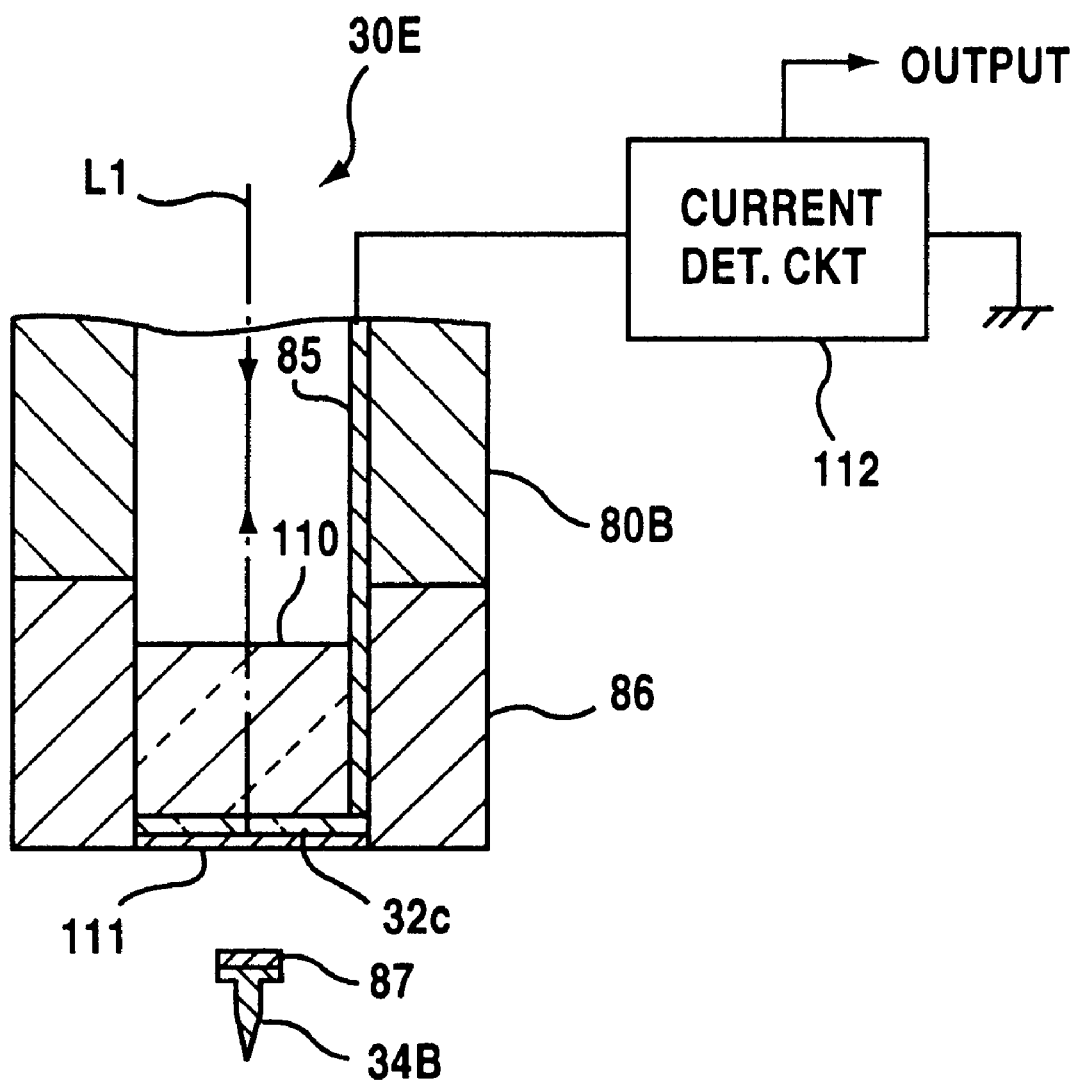
FIG. 16 is a fragmentary axial sectional view of the voltage and displacement sensitive probe in the sixth embodiment according to the present invention.

FIG. 16 shows an axial sectional view of the lower portion of the voltage and displacement sensitive probe 30E in the sixth embodiment. This lower portion applies a photoconductive gate and is symmetrical, excluding the lead wire 85, with respect to any plane through the axis thereof.

The photoconductive film 111 is adhered to the lower surface of the transparent substrate 110 via the electrically conductive transparent film 32c and the transparent substrate 110 is fitted inside the magnetic cylinder 86. The electrically conductive transparent film 32c is connected via the lead wire 85 that runs along the inner wall of the rod 80B, the cross beam 81 and the holder 82 shown in FIG. 10 to the current detection circuit 112 shown in FIG. 16. The current detection circuit 112 detects the electric current that flows in the lead wire 85, converts it to a voltage, amplifies it and then outputs it.

In the structure described above, when the light beam L1 enters into the rod 80B, it radiates on to the photoconductive gate film 111 through the transparent substrate 110 and the electrically conductive transparent film 32c to lower the resistivity at the irradiated point. Thus, an electric current that value corresponds to the voltage between the probing needle 34B and the electrically conductive transparent film 32c flows in the lead wire 85 to be detected by the current detection circuit 112.

In the sixth embodiment, the current detection circuit 112 is used instead of the device shown in FIG. 5 and the optical system can be constituted with the laser and the mirror for reflecting the laser beam to direct it into the rod 80B, thereby making the structure of the optical system particularly simple. All other aspects are identical to those in the fifth embodiment described earlier.

Seventh Embodiment

Figure 17:
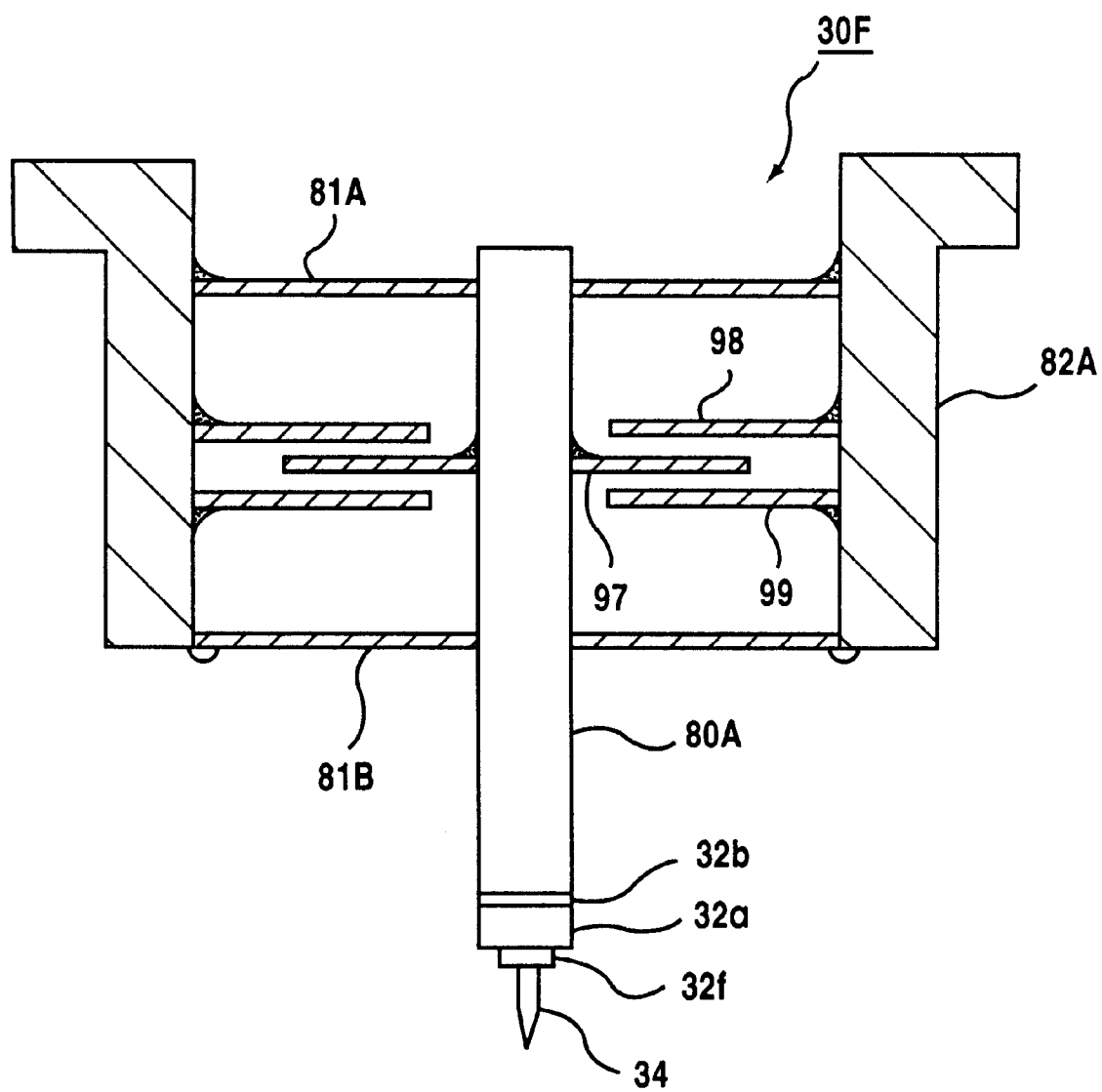
FIG. 17 is an axial sectional view of the voltage and displacement sensitive probe in the seventh embodiment according to the present invention.

FIG. 17 shows a partial axial cutaway view of the voltage & displacement sensitive probe 30F in the seventh embodiment. This voltage and displacement sensitive probe 30F is symmetrical with respect to plural planes through the axis thereof.

The rod 80A and the portion that is mounted at its lower end have the same structures as those shown in FIG. 10. The holder 82A corresponds to the holder 82 in FIG. 10 and the outer ends of the cross beams 81A, 81B each of which is identical to the cross beam 81 in FIG. 10, are bonded to the inner circumferential surface of the holder at the upper portion and the lower portion respectively, and the inner ends of the cross beams 81A, 81B are bonded to the external circumferential surface of the rod 80A. Between the cross beam 81A and the cross beam 81B, the inner end of the electrically conductive plate 97 is bonded perpendicular to the external circumferential surface of the rod 80A, and the outer ends of the electrically conductive plates 98 and 99 are bonded perpendicular to the inner circumferential surface of the holder 82A at a distance from the electrically conductive plate 97 in such a manner that they enclose the conductive plate 97 in order to detect a change in capacitance as the displacement of the rod 80A in the direction of the axis. In order to enable observation of the sample with an optical microscope through the inside of the the holder 82A, the electrically conductive plates 97, 98, 99 may be, for example, cross-shaped, similar to the cross beams 81A and 81B. A capacitance detection circuit that is connected to the electrically conductive plates 97, 98, 99 via a lead wire (not shown) may be a Wheatstone bridge circuit of the known art.

All other aspects are identical to those in the fourth embodiment described earlier.

Eighth Embodiment

Figure 18:
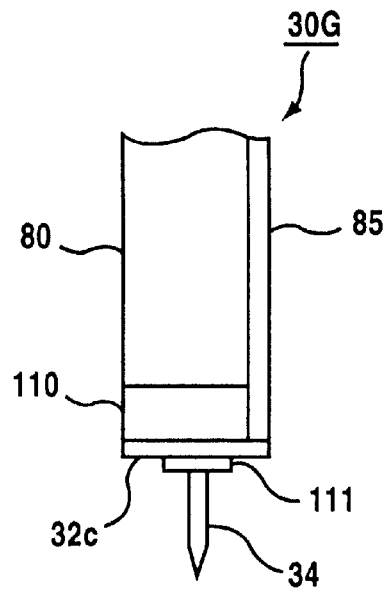
FIG. 18 is a fragmentary view of the lower portion of the voltage and displacement sensitive probe in the eighth embodiment according to the present invention.
Figure 19:
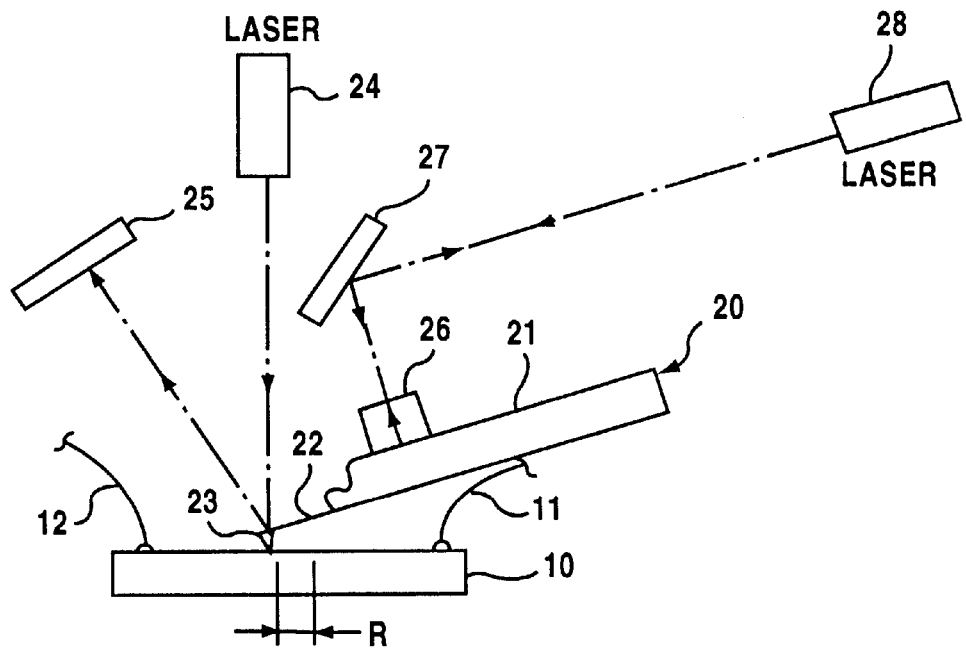
FIG. 19 is a schematic diagram of a voltage and displacement measuring apparatus to be considered for comparison with the present invention.

FIG. 18 shows the lower portion of the voltage and displacement sensitive probe 30G of the eighth embodiment. This lower portion is used instead of the rod 80A and what is installed at its lower end in FIG. 17. It is symmetrical, excluding the lead wire 85, with respect to a plurality of planes through the axis thereof.

A photoconductive gate, which is structured similarly to that shown in FIG. 16, is mounted to the lower end of the rod 80. Namely, the probing needle 34 is bonded on to the lower end of the rod 80 via the transparent substrate 110, the electrically conductive transparent film 32c and the photoconductive film 111. The transparent electrically conductive film 32c is connected to the lower end of the lead wire 85 that extends over the external circumferential surface of the transparent substrate 110 and the rod 80 in the direction of the axis.

Having described specific embodiments of the present invention, it is to be understood that modification and variation of the invention are possible without departing from the spirit and scope thereof.

What is claimed is:

1. A voltage & displacement sensitive probe comprising:
   a holder having a hole arranged approximately symmetrical with respect to plural planes through the axis thereof;
   a rod being hollow or solid and transparent;
   first and second elastic films bridging between said holder and said rod and supporting said rod vertically, said second elastic film being located beneath said first elastic film;
   an electro-optic crystal, first and second surfaces of which are parallel to each other and arranged vertically to the axis of said hole;
   a first electrode consisting of a transparent film adhered to said first surface and bonded to the lower end of said rod;
   a second electrode adhered to said second surface and connected electrically with said probing needle, said second electrode reflecting a light beam travelling from said first electrode through said electro-optic crystal and back;
   an electrically conductive probing needle being attached at its bottom surface to said second electrode, a tip of said probing needle pointing downward;
   a first electrically conductive plate, an end of which is bonded to said rod with the other end being free; and
   a second electrically conductive plate, an end of which is bonded to said holder with the other end being free, said second electrically conductive plate facing said first electrically conductive plate.

2. A voltage and displacement sensitive probe according to claim 1, wherein said rod is electrically conductive and is electrically connected to said first electrode, and said first or second elastic film is electrically conductive.

3. A voltage and displacement sensitive probe according to claim 2, wherein each of said first and second elastic films is a cross beam.

4. A voltage and displacement sensitive probe according to claim 3, further comprising a third electrically conductive plate, an end of which is bonded to said holder with the other end being free, said third plate facing said first plate with said first plate being between said second and third plates.

5. A voltage and displacement sensitive probe comprising:
   a holder having a hole being approximately symmetrical with respect to a plurality of planes through the axis thereof;
   an electro-optic crystal arranged concentrically with said hole, first and second surfaces thereof being parallel to each other;
   an electrode adhered to said first surface;
   a reflector for reflecting back incident light beam thereon travelled through said electro-optic crystal along an axis of said hole, said reflector being formed on said second surface;
   an electrically conductive probing needle coupled to the central portion of said second surface with a tip of said probing needle pointing downward;
   a rod, which permits light to pass through, bonded to said electrode at the bottom thereof; and
   an elastic film arranged inside of said hole, the outer end thereof being bonded to said holder while keeping a strain thereon, said rod being suspended at a central portion of said elastic film, said elastic film being approximately symmetrical with respect to a plurality of planes through the axis of said hole.

6. A voltage and displacement sensitive probe according to claim 5, wherein said rod is electrically conductive, and is electrically connected to said electrode, and said elastic film is electrically conductive.

7. A voltage and displacement sensitive probe according to claim 6, further comprising:
   a first electrically conductive plate, an end of which is bonded to said rod with the other end being free; and
   a second electrically conductive plate, an end of which is bonded to said holder with the other end being free, said second plate facing said first plate.

* * * * *